(12) United States Patent  
Fujisawa et al.

(10) Patent No.: US 7,332,226 B2  
(45) Date of Patent: Feb. 19, 2008

(54) TRANSPARENT CONDUCTIVE FILM AND ITS MANUFACTURING METHOD, AND PHOTOELECTRIC CONVERSION DEVICE COMPRISING IT

(75) Inventors: Akira Fujisawa, Osaka (JP); Masatoshi Nara, Osaka (JP); Takahiro Asai, Osaka (JP); Yukio Sueyoshi, Osaka (JP); Kiyotaka Ichiki, Osaka (JP); Koichiro Kiyohara, Osaka (JP); Masahiro Hirata, Hyogo (JP); Hiroki Ando, Osaka (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 295 days.

(21) Appl. No.: 10/432,505

(22) PCT Filed: Nov. 20, 2001

(86) PCT No.: PCT/JP01/10149

§ 371 (c)(1),  
(2), (4) Date: Aug. 22, 2003

(87) PCT Pub. No.: WO02/43080

PCT Pub. Date: May 30, 2002

(65) Prior Publication Data

US 2005/0029613 A1    Feb. 10, 2005

(30) Foreign Application Priority Data

Nov. 21, 2000 (JP) .............................. 2000-354956  
Nov. 21, 2000 (JP) .............................. 2000-355068  
Nov. 21, 2000 (JP) .............................. 2000-355079  
Dec. 19, 2000 (JP) .............................. 2000-385163  
Nov. 15, 2001 (JP) .............................. 2001-350207

(51) Int. Cl.  
    *B32B 17/06* (2006.01)

(52) U.S. Cl. .................... 428/432; 428/699; 428/701; 428/702

(58) Field of Classification Search ................ 428/432, 428/698, 699, 701, 702  
See application file for complete search history.

(56) References Cited

U.S. PATENT DOCUMENTS

| 4,500,743 | A |   | 2/1985 | Hayashi et al. |
| 4,732,621 | A |   | 3/1988 | Murata et al. |
| 4,808,462 | A | * | 2/1989 | Yaba et al. ................ 428/142 |
| 6,355,353 | B1 |  | 3/2002 | Hyodo et al. |

(Continued)

FOREIGN PATENT DOCUMENTS

EP    1 036 774    9/2000

(Continued)

*Primary Examiner*—Gwendolyn Blackwell  
(74) *Attorney, Agent, or Firm*—Hamre, Schumann, Mueller & Larson, P.C.

(57) ABSTRACT

A transparent conductive film wherein the height number distribution of projections present on the surface is expressed by a distribution function of $\chi^2$ type having a degree of freedom of 3.5 to 15 when the unit of the horizontal axis is a nanometer, the height/width ratio number distribution is expressed by a distribution function of $\chi^2$ type having a degree of freedom of $10\text{-}35\chi^2$, the projections having a height of 50-350 nm account for 70% or more, and the projections having a height/width ratio of 0.25-1.02 account for 90% or more.

12 Claims, 11 Drawing Sheets

U.S. PATENT DOCUMENTS 6,498,380 B1 * 12/2002 Otani et al. .................. 257/432

FOREIGN PATENT DOCUMENTS

| EP | 1 061 585 A2 | 12/2000 |
|---|---|---|
| JP | 62-7716 | 2/1987 |
| JP | 63-227781 | 9/1988 |
| JP | 2-503615 | 10/1990 |
| JP | 3-28073 | 4/1991 |
| JP | 4-133360 | 5/1992 |
| JP | 6-168897 | 6/1994 |
| JP | 8-28336 | 3/1996 |
| JP | 11-195801 | 7/1996 |
| JP | 2000-261013 | 9/2000 |
| WO | 88/09265 | 12/1988 |

* cited by examiner

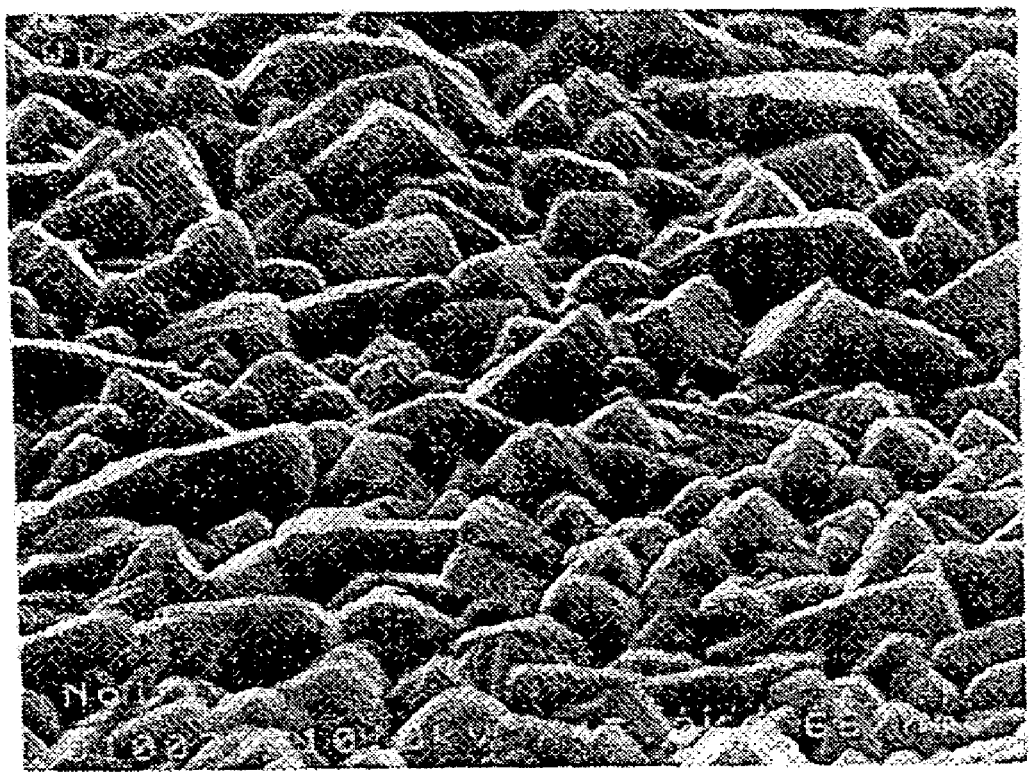
F I G. 3

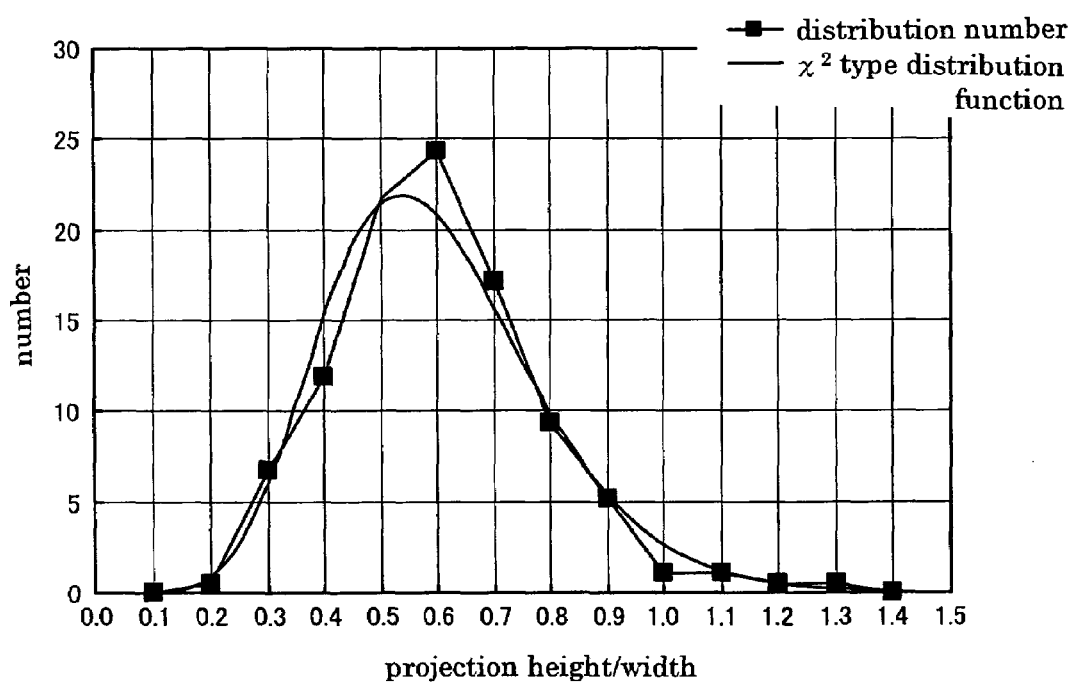
F I G. 5

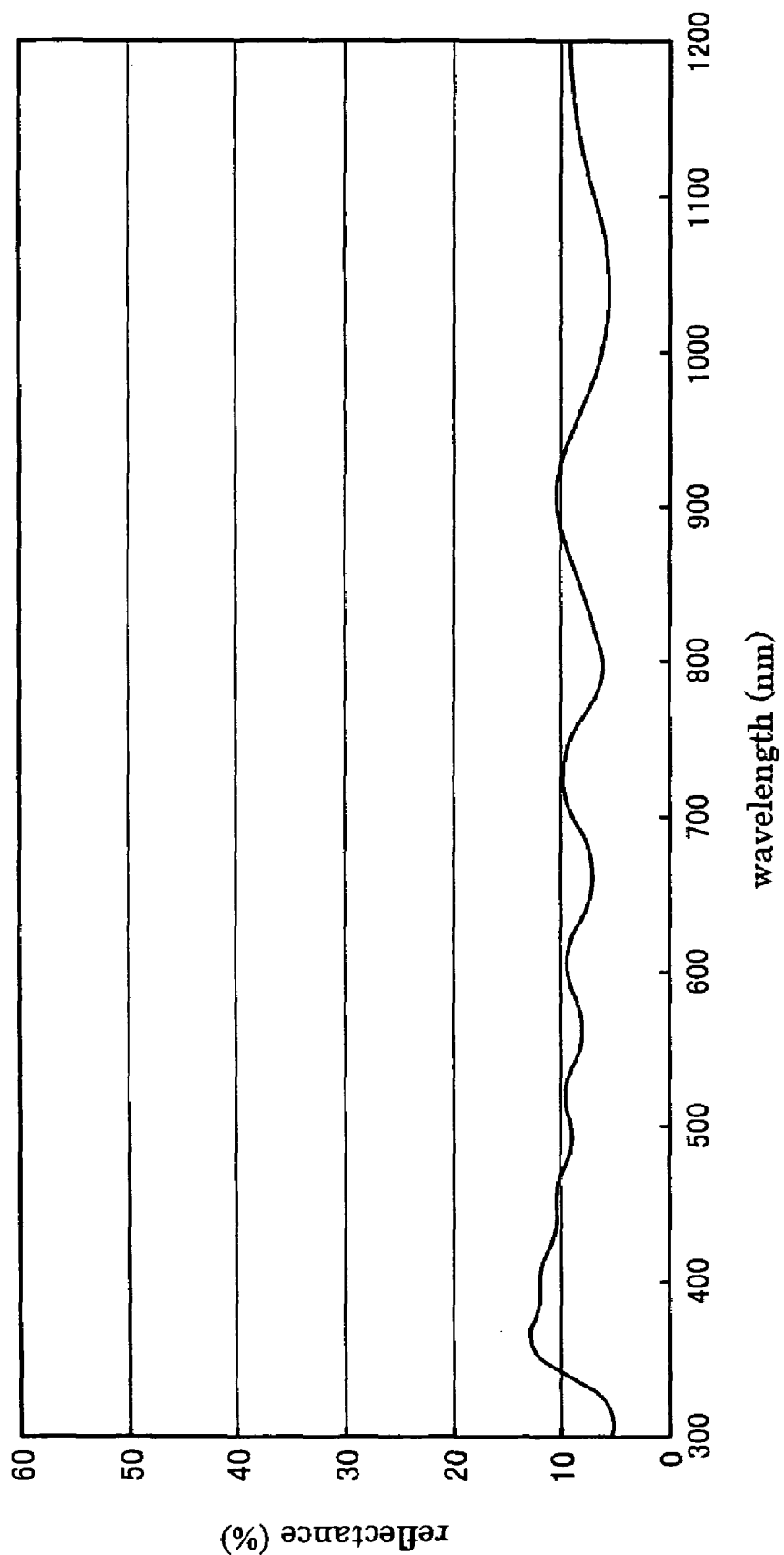
F I G. 7

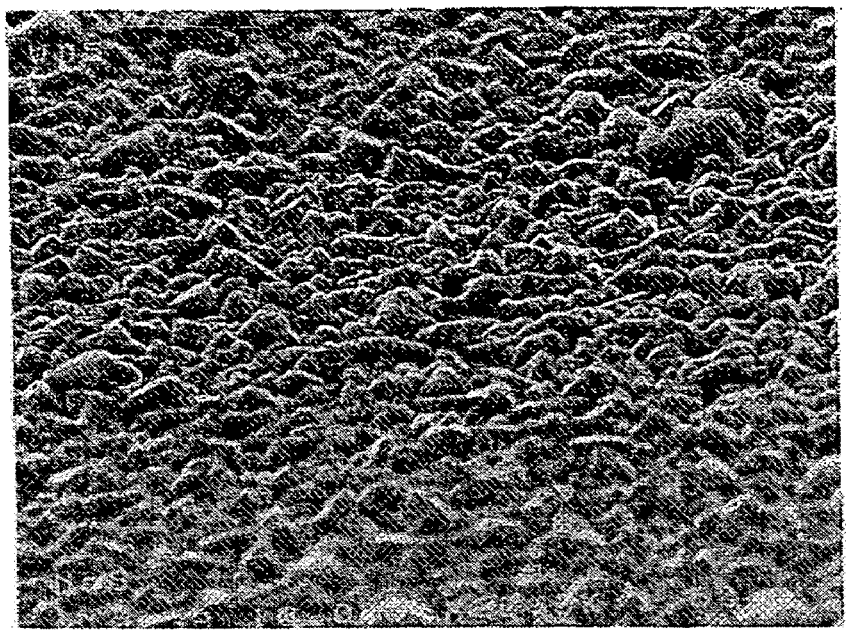
F I G. 1 0 A
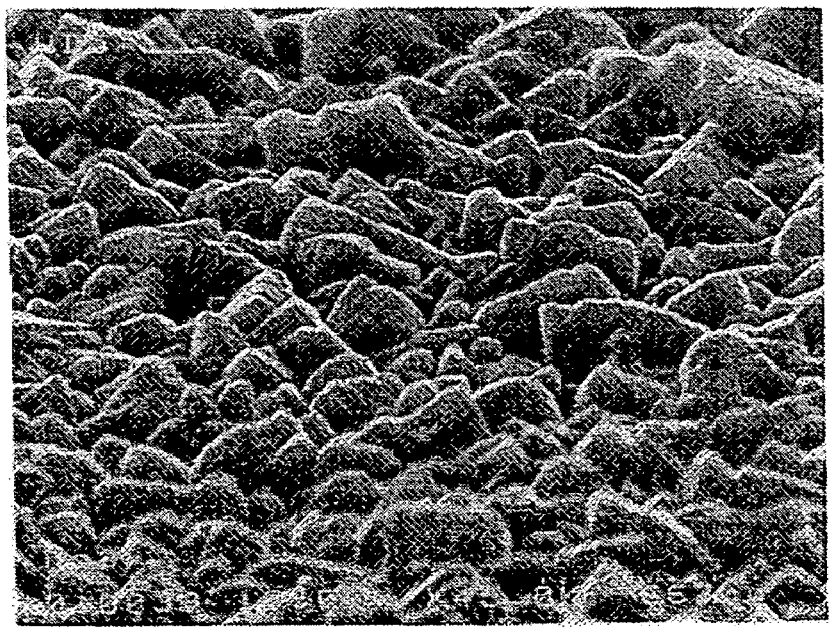
F I G. 1 0 B

TRANSPARENT CONDUCTIVE FILM AND ITS MANUFACTURING METHOD, AND PHOTOELECTRIC CONVERSION DEVICE COMPRISING IT

TECHNICAL FIELD

The present invention relates to transparent conductive films that can be used as thin film electrodes of photoelectric conversion devices, of which a representative example is a solar cell, methods for manufacturing them, substrates provided with them, and photoelectric conversion devices using these substrates.

BACKGROUND ART

Recent energy and environmental issues have drawn attention toward solar cells. From the standpoint of conserving resources, thin-film type solar cells will likely become mainstream. In general, devices in which a transparent conductive film, made of tin oxide ($SnO_2$) for example, and an amorphous semiconductor such as amorphous silicon or amorphous silicon germanium serving as a photoelectric conversion layer are formed on a transparent substrate such as a glass sheet are used as thin-film solar cells.

Thermal decomposition methods often are used to form such transparent thin films, and transparent conductive films formed by such methods are polycrystalline. In the case of polycrystalline bodies of tin oxide, crystal growth proceeds as the transparent conductive film grows in thickness, resulting in the surface of the transparent conductive film becoming uneven. Thin-film solar cells are designed to exploit this unevenness in the surface of the transparent thin film and scatter incident light, and thereby increase the length of the optical path in the photoelectric conversion layer, exhibiting a so-called "light trapping effect." Exhibiting this light trapping effect results in an improvement in the conversion efficiency of the photoelectric conversion device.

For example, JP S62-7716B discloses an amorphous silicon solar cell in which the average grain diameter in the surface of the transparent electrode is not less than 0.1 µm and not more than 2.5 µm, and mentions that the correlation between the size of the crystal grain diameter of the transparent electrode and the efficiency of the amorphous silicon solar cell was examined. However, the grain diameter generally exhibits the above-mentioned average grain diameter if a transparent electrode such as an indium oxide film or a tin oxide film is formed through a spray method or CVD (chemical vapor deposition), which are mentioned in this publication. The publication does not mention the ideal height of the crystal grain diameter or the distribution of the diameter or the height of the grains.

JP H2-503615A discloses a solar cell substrate that includes a conductive film having projections with diameters of 0.1 to 0.3 µm and a height/diameter ratio of 0.7 to 1.2 in its surface. However, this publication does not mention the distribution of the height of the projections or of the height/diameter ratio.

JP H4-133360A discloses a photovoltaic device that includes a tin oxide film whose surface has projections in the shape of truncated pyramids with heights of 100 to 300 nm and in which the angles between them and the normal of the principle surface of the substrate are 30° to 60°. However, this publication does not mention the distribution of the height of the projections or of the angles between the normal lines and the main surface of the substrate.

JP H3-28073B discloses a photovoltaic device having a translucent conductive oxide provided with an uneven surface with an average grain diameter of approximately 50 to 200 nm, a height difference of approximately 100 to 500 nm, and a spacing between projections of approximately 200 to 1000 nm. However, it does not mention the distribution of the grain diameters or of the height difference.

All of the photoelectric conversion devices disclosed in these laid-open publications are under the premise that amorphous silicon is used for the photoelectric conversion layer. Amorphous silicon as a material is well suited for the photoelectric conversion layer of photoelectric conversion devices because even at a low film thickness it exhibits high photoelectric conversion efficiency. The film thickness of photoelectric conversion layers made of intrinsic amorphous silicon is about 50 to 700 nm, whereas in the case of p-type and/or n-type conductive amorphous silicon layers in contact with the transparent conductive film, the film thickness is about 3 to 100 nm.

With a photoelectric conversion layer made of amorphous silicon, however, although the absorption coefficient of light at wavelengths shorter than its energy gap is large, the absorption coefficient of light on the long wavelength side thereof progressively diminishes as the wavelength increases. For this reason, most light on the long wavelength side is discharged outside the system of the photoelectric conversion device without being absorbed by the photoelectric conversion layer. Increasing the length of the optical path in the photoelectric conversion layer is the most effective way to increase the amount of light on the long wavelength side that is absorbed. Although the light trapping effect is exhibited somewhat even with conventional transparent conductive films, because there is such a strong relationship between the shape of the unevenness in the surface and the wavelength of the light, a shape that effectively scatters light in the absorption region of amorphous silicon is not necessarily also effective for light at long wavelengths. In other words, there is a separate shape that is suited for dispersing light at long wavelengths for the unevenness in the surface of a transparent conductive film.

In recent years, photoelectric conversion layers constituted by amorphous silicon-germanium, thin film polycrystalline silicon, or microcrystalline silicon, for example, in place of amorphous silicon have started to come into use. These absorb much of the light at wavelengths longer than the visible spectrum region, which is the absorption region of amorphous silicon.

Consequently, future increases the conversion efficiency of solar cells will require transparent conductive films that can effectively scatter light of wavelengths longer than the absorption region of amorphous silicon.

Conventionally, due to inadequate research on the relationship between the surface shape of transparent conductive films and the wavelength of the scattered light, it was thought that it was important to scatter light of wavelengths below the absorption region of amorphous silicon. This ultimately resulted in a tendency toward greater uniformity in the surface unevenness of transparent conductive films. When the surface unevenness of a transparent conductive film is made uniform, the reflectance of the transparent conductive film is increased, and if the transparent conductive film has a high reflectance, then light cannot sufficiently enter the photoelectric conversion layer because incident light that has been transmitted through the transparent substrate is reflected by the transparent conductive film. This resulted in the problem of a drop in the conversion efficiency of the photoelectric conversion device.

The present invention has an aspect that was arrived at in light of the above problems. It is an object of this aspect, at least in a preferable embodiment of the invention, to provide a transparent conductive film with which light of wavelengths longer than the absorption region of amorphous silicon can be scattered effectively and which itself has a low reflectance. It is a further object to provide a photoelectric conversion device that is furnished with this transparent conductive film and that has improved photoelectric conversion efficiency. Hereinafter, the invention having this aspect is referred to as the "invention of the first embodiment."

The above-mentioned publications frequently mention the shape of the surface of the transparent conductive film, however, they do not touch upon a case in which the projections are of different shapes or mention their size. A transparent conductive film having many projections with trapezoid-shaped cross sections has increased reflectance, lowering the amount of incident light on the photoelectric conversion layer. When the trapezoid-shaped projections are large, parts of the p-type amorphous silicon layer of the photoelectric conversion layer in contact with the transparent conductive film become thin, leading to instances in which shorts occur between the transparent conductive film and the i-type layer formed on the p-type layer. Also, the thickness distribution of the p-type layer becomes nonuniform, which at times also leads to nonuniformity at the p-i junction or the in junction. As a result, there is a drop in the characteristics of the photoelectric conversion device.

The present invention has another aspect that was arrived at in light of these problems. It is an object of this aspect, in at least a preferable embodiment of the invention, to provide a high performance photoelectric conversion device, and a transparent conductive film used in that photoelectric conversion device, in which the reflectance of the transparent conductive film is kept low by reducing the proportion of projections regarded as having trapezoid-shaped cross sections, and in which shorts are prevented by reducing the number of large trapezoid-shaped projections. Hereinafter, this is referred to as the "invention of the second embodiment."

When there are defects such as pinholes in even one of the p-type, i-type, or n-type layers in the photoelectric conversion layer, shorts may occur and the photoelectric conversion efficiency drops noticeably. When the p-type and/or n-type layers are increased in thickness in order to prevent such defects from occurring, the amount of light that is absorbed in those layers is increased, reducing the amount of light that is incident on the i-type layer, which is the photoelectric conversion layer. Also, it leads to nonuniformity at the p-i junction or the i-n junction, which lowers the photoelectric conversion efficiency. Consequently, in light of this problem, the transparent conductive film should be given a level surface. On the other hand, if the light trapping effects are to be exploited, then it is conceivably preferable that the surface has numerous large protrusions in order to raise the photoelectric conversion efficiency and in particular to increase the effect of scattering long wavelength light.

After intense research regarding the shape of a transparent conductive film surface that adequately achieves these conflicting desirable characteristics, the present inventors found that a state in which there are both few very large projections that protrude out and also numerous relatively large projections is ideal.

In other words, in yet another aspect of the invention, in at least a preferable embodiment thereof, it is an object to provide a transparent conductive film having tin oxide at its main component and an ideal surface shape to serve as the thin film electrode of a photoelectric transducer element. Hereinafter, this invention is referred to as the "invention of the third embodiment."

DISCLOSURE OF INVENTION

The present invention comprises the above-mentioned three embodiments, and the object shared by these three embodiments is to increase the photoelectric conversion efficiency of a photoelectric conversion device.

According to the invention of the first embodiment, there is provided a transparent conductive film wherein, with respect to projections present in its surface, the average value of a number distribution of height is larger than its mode, and when the number distribution of height is regarded as following an $\chi^2$ type distribution function in which a horizontal axis is displayed in nanometer units, then the degree of freedom with which it can best be approximated is 3.5 to 15;

the average value of a number distribution of the height/width ratio is larger than its mode, and when the number distribution of the height/width ratio is regarded as following an $\chi^2$ type distribution function, then the degree of freedom with which it can best be approximated is 10 to 35;

the number of projections having a height of 50 to 350 nm is at least 70%; and the number of projections having a height/width ratio of 0.25 to 1.05 is at least 90%.

According to the invention of the second embodiment, there is provided a transparent conductive film whose area occupied by projections that, when their cross section shape is regarded as a trapezoid, have a slope of an upper side with respect to a lower side of the trapezoid of not more than 20° and a ratio of a length of the upper side to the lower side of at least 0.8, corresponds to not more than 10% of an area of a surface on which the transparent conductive film is formed.

According to the invention of the third embodiment, there is provided a transparent conductive film that is a thin film whose main component is tin oxide and whose thickness is at least 400 nm, and a variance in diameter of the projections in its surface is not more than 0.01 $\mu m^2$.

The invention also provides a method suited for the production of these transparent conductive films. In one embodiment of this method, a transparent conductive film is formed on a surface of a substrate at 550° C. to 650° C. through a thermal decomposition method and a mixed gas used in the thermal decomposition method includes at least 10 mole percent of a gas whose density in a standard state is not more than 1 g/L. In another embodiment of this method, a transparent conductive film is formed through a thermal decomposition method and a mixed gas used in the thermal decomposition method includes a chlorine atom containing gas at a concentration of not more than 10 mole percent and tin compounds.

The invention further encompasses a substrate for a photoelectric conversion device including the above transparent conductive film and a transparent substrate, wherein the transparent conductive film is formed on the substrate. The invention also includes a photoelectric conversion device including the above substrate for photoelectric conversion device and at least one photoelectric conversion layer.

BRIEF DESCRIPTION OF DRAWINGS

FIG. 3 shows the appearance of the transparent conductive film produced in Working Example 2 observed using a scanning electron microscope (SEM).

FIG. 5 is a diagram showing the number distribution function of height/width of the projections of the transparent conductive film produced in Working Example 2.

FIG. 7 is a diagram showing the measured data on the reflectance of the transparent conductive film produced in Working Example 2.

FIG. 10 shows the appearance of the surface of the transparent conductive film of Working Example 8 observed by SEM, where FIGS. 10A and 10B correspond to magnifications of 20,000 and 45,000 times, respectively.

EMBODIMENTS OF THE INVENTION

Figure 1:
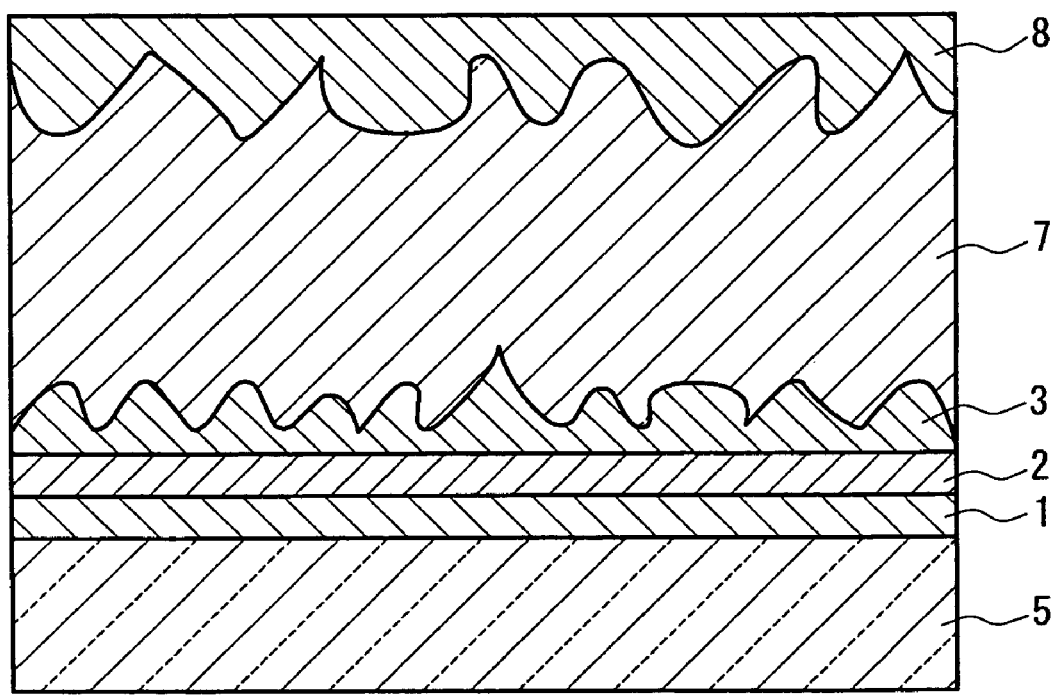
FIG. 1 is a cross-sectional diagram that schematically shows an embodiment of a photoelectric conversion element of the invention.

Embodiments of the invention are explained in detail below, however, the invention is not limited to the following embodiments.

First, the first embodiment of the invention, that is, the invention relating to a transparent conductive film that effectively scatters light of wavelengths longer than the absorption region of amorphous silicon and that has a low reflectance, is described.

As mentioned above, the size of the unevenness in the surface of the transparent conductive film and the wavelength of the light that is scattered by the surface are closely related, and it is necessary to increase the size of the surface unevenness over that seen conventionally in order to scatter light of wavelengths longer than the absorption region of amorphous silicon. However, when each projection of the transparent conductive film is grown large, the scattering of light near the absorption region of amorphous silicon is reduced, which conversely poses the risk of lowering the light trapping effects in all wavelength regions and leading to shorts due to large projections.

Accordingly, after intense research on the relationship between the surface shape of the transparent conductive film and the wavelength of the scattered light, the present inventors found that if the transparent conductive film is to be used in a thin film solar cell, then a condition in which a certain degree of homogeneity is maintained in the surface shape of the transparent conductive film and at the same time the surface is provided with appropriate dispersion properties is preferable.

A surface shape that is appropriately provided with both homogeneity and dispersion properties is provided with the following characteristics with regard to the projections in its surface. With respect to the number distribution of the height of the projections, the average value is larger than its mode, and when the distribution is regarded as following an $\chi^2$-type distribution function ($\chi^2$ distribution) in which the horizontal axis is displayed in nanometer units, the degree of freedom with which it can be best approximated is from 3.5 to 15. Also, with respect to the number distribution of the height/width ratio distribution of the projections, the average value is larger than its mode and when the distribution is regarded as following an $\chi^2$ distribution the degree of freedom with which it can best be approximated is from 10 to 35. At least 70% of the projections have a height of 50 to 350 nm and at least 90% of the projections have a height/width ratio of 0.25 to 1.05. These conditions were obtained recursively based on the results of a large number of experiments performed by the present inventors. With this transparent conductive film, the reflectivity of the film itself is reduced, allowing interference by the reflectance spectrum to be suppressed, and a large amount of light can be incorporated into the photoelectric conversion layer of the solar cell, even with the amount of light in the wavelength regions remaining the same.

Here, the method for measuring the height of the projections and the width of the projections is described. The height of the projections is calculated based on an SEM photograph captured from above at an elevation angle of 30° and a magnification of 45,000 times. More specifically, for projections entirely captured in the SEM photograph, a vertical line is drawn from the vertex of each projection to its base line, and from the length of this vertical line the height is calculated. The width of the projections is found for projections entirely captured in the SEM photograph by calculating the distance between the vertex of a certain projection and the vertex of the nearest projection based on the SEM photograph.

If the number distribution of the height of the projections follows an $\chi^2$-type distribution function, then there are hardly any large projections that protrude outward and at the same time a certain degree of variation is maintained in the height of the projections. To effectively exhibit the light trapping effects, it is necessary that the average grain diameter is large to a certain extent, and variation in the grain diameter is necessary in order to cause light scattering at various wavelengths. However, although a certain extent is necessary, too many large projections leads to poorer photoelectric conversion properties, in that the film thickness of the p-type amorphous silicon layer formed on the transparent conductive film becomes thin in parts, leading to shorts between the transparent conductive film and the i-type layer formed after the p-type layer, and the thickness distribution of the p-type layer becomes nonuniform, leading to heterogeneity in the later-formed p-i or i-n junctions.

One example of a representative distribution function is a normal distribution function, however, in a normal distribution, in principle the value at which the frequency is a maximum (mode) is the average value, and grains smaller and larger than that are symmetrical. When the distribution of the number of projections follows a normal distribution, the proportion of large grains increases if the average grain diameter demonstrates a certain degree of size. For this reason, variation according to an $\chi^2$-type distribution function, in which the percentage of large grains is small, is preferable. With respect to the degree of freedom of an $\chi^2$-type distribution function, it is desirable that when the horizontal axis represents the height of the projections in nanometer units and grades are set every 50 nm and the frequency is displayed for each grade, then the degree of freedom can be best approximated at 3.5 to 15. When the degree of freedom is less than 3.5, there are too many tiny grains, and thus the light trapping effects cannot be adequately exhibited. When the degree of freedom is greater than 15, there are too many large grains.

If the number distribution representing the ratio of the height of the projections with respect to the width of the projections follows an $\chi^2$-type distribution function, then a certain extent of variation is maintained in the width of the projections and at the same time there are not many projections that are either too steep or too flat. The degree of freedom of the $\chi^2$-type distribution function at this time can be best approximated at 10 to 35. When the degree of freedom is less than 10, there are too many projections with gentle slopes, and thus the effect of reducing the reflectance is inhibited. On the other hand, when the degree of freedom is greater than 35, there are too many steep projections, and thus the p-type amorphous silicon layer formed on the transparent conductive film becomes thin in parts, leading to deterioration of the photoelectric conversion properties in the same manner as described above.

Here, an $\chi^2$-type distribution function ($\chi^2$ distribution) will be explained. In a normal distribution function, in principle the mode is the average value, whereas in an $\chi^2$-type distribution function, a value that is slightly larger than the mode becomes the average value. For this reason, in an X-Y correlation diagram, there is relatively large expansion in the positive direction of the x-axis in an $\chi^2$-type distribution function. Also, with respect to the height of the projections and the ratio of the height of the projections to the width of the projections, if those measured results are plotted in an $\chi^2$-type distribution function and the most appropriate degree of freedom falls within the above-mentioned range, then the effects of the invention of the first embodiment are achieved reliably.

The light trapping effects cannot be attained adequately when there is a large number of projections that are less than 50 nm in height, and the effects of reducing the reflectance cannot be adequately obtained if there are too many projections in which the height to width ratio (height/width) of the projections is less than 0.25. On the other hand, if there are too many projections with heights over 350 nm and if there are too many projections with a height to width ratio in excess of 1.05, then the p-type amorphous silicon layer formed on the transparent conductive film becomes thin in parts, leading to shorts between the later-formed i-type layer and the transparent conductive film, and the thickness distribution of the p-type layer becomes nonuniform. This leads to heterogeneity in the later-formed p-i junction and i-n junction, deteriorating the photoelectric conversion properties. In other words, with respect to the projections in the surface of the transparent conductive film, it is preferable that the number of projections that have a height of 50 to 350 nm is not less than 70% and that the number of projections with a height/width ratio of 0.25 to 1.05 is not less than 90%. More preferably, the number with a height of 100 to 350 nm is preferably not less than 30% and the number with a height to width ratio of 0.35 to 0.95 is not less than 80%. When there are too many projections that are less than 100 nm in height, it becomes difficult to exhibit the light trapping effects, and the effects of reducing the reflectance cannot be adequately attained either. To adequately obtain the effect of reducing reflectance, it is preferable that the number of projections in which the height to width ratio is less than 0.35 also is reduced.

To scatter light in long wavelength regions and obtain the effect of trapping light in these regions, it is preferable that the number of projections that are at least 250 nm high is in the range of 0.2 to 20%. When less than 0.2%, the effects of trapping light in long wavelength regions is not adequately exhibited, and when greater than 20%, the p-type amorphous silicon layer formed on the transparent conductive film becomes thin in parts.

If the surface unevenness of the transparent conductive film is in the above state, then the average reflectance of a transparent substrate provided with the transparent conductive film can be kept to 10% or less for wavelengths of 300 to 1200 nm. Here, the average reflectance is the value measured at the opposite surface to the surface on which the transparent conductive film is formed. The average reflectance is the total amount of light that is directly reflected by the surface of the transparent substrate and the light that is reflected by the transparent conductive film. It should be noted that to accurately carry out measurement, it is necessary that the directionality of the measuring device is adjusted suitably so that the device does not pick up stray light that has been subjected to multiple scattering and/or multiple reflecting.

With this transparent conductive film, the conversion efficiency of the photoelectric conversion device can be improved not only if the photoelectric conversion layer is amorphous silicon, of course, but also in a case in which it is thin film polycrystalline silicon, for example, which promises to become mainstream in the future.

A configuration in which this transparent conductive film is used in a thin film solar cell, that is, a photoelectric conversion device, is described with reference to FIG. 1. In the photoelectric conversion device shown in FIG. 1, undercoating films 1 and 2, a transparent conductive film 3, a photoelectric conversion layer 7, and a rear surface electrode 8 are formed in that order on a transparent substrate 5 disposed on the light incidence side.

As long as the transparent substrate 5 is a transparent insulating body, there are no particular limitations with respect to its type. However, it is preferably provided with sufficient heat resistance to withstand thermal decomposition methods. Consequently, a glass sheet is ideal as the transparent substrate.

If a glass sheet is used as the transparent substrate, then it is preferable that the undercoating films 1 and 2 are provided in advance before the transparent conductive film is formed. Glass sheets ordinarily contain large quantities of alkaline components. Thus when a transparent conductive film is formed directly on its surface the alkaline components diffuse into the transparent conductive film, deteriorating performance by raising the electrical resistance or lowering the transmittance, for example. In addition, undercoating films also perform the functions of adjusting the surface shape of the transparent conductive film to a specific shape and increasing the adhesion strength between the transparent substrate and the transparent conductive film, for example. The film thickness of the undercoating films is preferably 5 to 150 nm, and it is preferable that their main component is silicon oxide and/or aluminum oxide. The undercoating layer can be constituted by one layer, or two or more layers.

If the undercoating layer is constituted by two or more layers, then it is preferable that the first undercoating layer 1, which is formed directly on the glass substrate, has a film thickness of 5 to 100 nm and has a refractive index of 1.6 to 2.5. The first undercoating layer 1 preferably includes as its main component at least one species selected from the group consisting of tin oxide, titanium oxide, and aluminum oxide. The second undercoating layer 2, which is nearer the transparent conductive film 3, preferably has a film thickness of 5 to 100 nm and a refractive index of 1.4 to 2.0. The second undercoating layer 2 preferably includes as its main component at least one selected from the group consisting of silicon oxide, aluminum oxide, and tin oxide. The refractive index of the first undercoating layer is preferably higher than the refractive index of the second undercoating layer.

The transparent conductive film 3 is ideally a thin film whose main component is tin oxide, a thin film whose main component is indium oxide, or a thin film whose main component is zinc oxide. In this specification, "main component," as it is usually defined, refers to a component that constitutes at least 50 atom percent of the composition, and by definition it does not exclude the presence of trace components. For example, a thin film whose main component is tin oxide may include tin oxide doped with fluorine or antimony, for example. Tin oxide doped with a predetermined concentration of fluorine ($SnO_2$:F) is particularly preferable. If it is doped with fluorine, it is preferable that the concentration of the fluorine is not more than 0.15 weight percent and that the refractive index at that time is approximately 1.9. Other examples of components include silicon, aluminum, zinc, copper, indium, bismuth, gallium, boron, vanadium, manganese, and zirconium. However, it is preferable that the concentration of these components is not more than 0.02 weight percent. The sheet resistance of the transparent conductive film is preferably 5 to 30 Ω/□ (square). In consideration of this value, the film thickness of the transparent conductive film on the light incidence side is preferably 500 to 2000 nm.

The photoelectric conversion layer 7 is made of amorphous silicon, for example, and after the transparent conductive film 3 has been formed, it is formed on the transparent conductive film 3 through publicly known means, such as vapor deposition, thermal CVD, or plasma CVD using glow discharge in which monosilane diluted by hydrogen gas serves as the raw material. The thin film of amorphous silicon can be formed by suitably adding methane, aluminum, diborane, or phosphine, for example, to a thin film of silicon and then forming a p-type layer, an i-type layer, and an n-type layer in that order from the transparent conductive film side in order to form an ordinary p-i-n junction. Of course, in place of amorphous silicon it is also possible to form a compound semiconductor thin film such as amorphous silicon germanium, microcrystalline silicon, microcrystalline silicon carbide, thin film polycrystalline silicon, crystalline silicon, CdTe, or $CuInSe_2$, for example, as the photoelectric conversion layer. The photoelectric conversion layer can be made of a single thin film layer of amorphous silicon or can be made of a layered thin film in which amorphous silicon and microcrystalline silicon are on top of one another. The film thickness of conductive-type (p-type, n-type) microcrystalline silicon is preferably 3 to 100 nm and more preferably 5 to 50 nm. In a photoelectric conversion device provided with a crystalline photoelectric conversion layer such as microcrystalline silicon, the transmittance of the transparent conductive film has a greater effect on the photoelectric conversion efficiency of the film than the sheet resistance does. It should be noted that before the rear surface electrode is formed it is also possible to form a thin film such as a zinc oxide film beforehand for the purpose of improving the reflectance and preventing the diffusion of impurities.

The shape of the surface of the photoelectric conversion layer 7 depends on the surface shape of the transparent conductive film 3. For that reason, by processing the transparent conductive film beforehand through etching, blasting, or stamping, for example, the shape of the unevenness in the surface of the photoelectric conversion layer can be controlled.

The intrinsic amorphous silicon layer (i-type layer) is preferably formed through plasma CVD with the temperature of the transparent substrate at not more than 450° C. This layer can be formed as a substantially intrinsic semiconductor thin film in which the density of the conduction-type determining impurity atoms is not more than $1 \times 10^{18}$ $cm^{-3}$. The film thickness of the intrinsic amorphous silicon layer is preferably 0.05 to 0.5 μm.

The rear surface electrode 8 is formed on the photoelectric conversion layer. This rear surface electrode, like the transparent conductive film, can be a thin film whose main component is tin oxide, or it may be at least one layer of a metallic thin film of at least one material selected from aluminum (Al), silver (Ag), gold (Au), copper (Cu), platinum (Pt), and chromium (Cr). This metallic thin film can be formed through sputtering or vapor deposition. If a metallic thin film is used as the rear surface electrode, then it is also possible to provide a layer made of a conductive oxide such as indium-doped tin oxide (ITO), tin oxide ($SnO_2$), or zinc oxide (ZnO) between the photoelectric conversion layer and the rear surface electrode.

It should be noted that the present inventors measured the surface unevenness of the photoelectric conversion layer and analyzed these results in combination with the results of a measurement of the surface unevenness of the transparent conductive film, and found that the reflectance of the rear surface electrode is low if the ratio of the average projection height divided by the average width to adjacent projections at the interface of the rear surface electrode is smaller than that of the transparent conductive film.

There are no particular limitations to the method for forming the transparent conductive film, although it is preferably formed through a thermal decomposition method. Publicly known examples of thermal decomposition methods include spray methods and CVD, and CVD is preferable because the surface shape can be adjusted through controlling the type or flow of the raw material for the tin, the raw material for oxidation, and the raw material for the additives. If undercoating films are provided, CVD is preferably used in the same fashion as it is for the transparent conductive film. The surface shape of the undercoating films has a large impact on the surface shape of the transparent conductive film, and thus selecting the type, number, and thickness, for example, of the undercoating films is important. If CVD is used, the surface shape of the undercoating films can be adjusted easily and moreover the undercoating films and the transparent conductive film can be formed contiguously in a series of film-formation steps.

An example of a thermal decomposition method is so-called "on-line CVD," which is a CVD method in which the thermal decomposition reaction of the raw gas is allowed to proceed on the surface of a molten glass ribbon on the line in which the glass sheet is manufactured through a float method. Using on-line CVD allows thin films to be formed on the surface of the glass ribbon, which is hotter than the softening point of glass, and thus a thin film that is higher quality than those formed through other thermal decomposition reactions is formed. Localized temperature irregularities in the surface temperature of the glass ribbon are small, and thus variations in the thickness of the film, for example, are small and the formation of massive projections and pinholes is prevented. Also, because the heat that is generated from the glass ribbon expedites the thermal decomposition reactions, the films are formed quickly and energy costs can be kept down because the addition of heat is not necessary. On-line CVD is suited for forming films with large areas, and it is particularly useful in applications in which the films can be applied to large-area photoelectric conversion devices, such as the windowpanes of buildings and the like or as roof material, for example.

Figure 2:
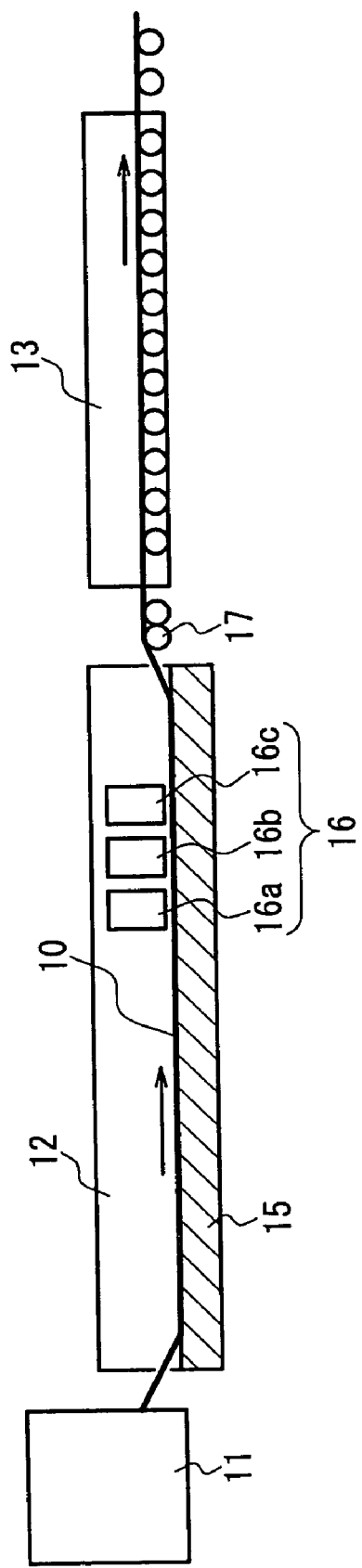
FIG. 2 is a diagram that schematically shows a device for use in an on-line CVD method.

FIG. 2 shows an example of a device used in on-line CVD. With this device, a glass ribbon 10 flows from a melting furnace (float crucible) 11 into a tin float tank (float bath) 12 and is moved in a belt-like manner over a tin bath 15. A predetermined number of coaters 16 (in the configuration of the drawing, there are three coaters 16a, 16b, and 16c) are disposed at a predetermined distance from the surface of the glass ribbon 10. Raw material in a gaseous state is supplied from these coaters, forming a contiguous thin film on the glass ribbon 10. Employing a plurality of coaters allows an undercoating film and a conductive film to be formed contiguously on the glass ribbon 10. The glass ribbon 10 on which the thin films, including the transparent conductive film, have been formed is lifted up by rollers 17 and delivered into a cooling furnace 13. It should be noted that the glass sheet cooled in the cooling furnace 13 is cut into glass sheets of a predetermined size by a float method general-purpose cutting device not shown in the drawing.

When using CVD to form undercoating films and/or a transparent conductive film whose main component is tin oxide, examples of the raw material for the tin include tin tetrachloride, dimethyltin dichloride, dibutyltin dichloride, tetramethyltin, tetrabutyltin, dioctyltin dichloride, and monobutyltin trichloride. Organic tin halides such as dimethyltin dichloride and monobutyltin trichloride are particularly preferable. Oxygen, water vapor, or dry air, for example, can be employed as the oxidizing agent for forming tin oxide from the raw material for tin. Examples of the raw material for fluorine include hydrogen fluoride, trifluoroacetate, bromotrifluoromethane, and chlorodifluoromethane, for example. If antimony is used as the dopant, then antimony pentachloride or antimony trichloride, for example, can be used.

If a thin film preferably made of silicon oxide is formed through CVD as an undercoating film, then examples of the raw material for the silicon include monosilane, disilane, trisilane, monochlorosilane, dichlorosilane, 1,2-dimethylsilane, 1,1,2-trimethyldisilane, 1,1,2,2-tetramethyldisilane, tetramethyl orthosilicate, or tetraethyl orthosilicate, for example. Examples of the oxidizing agent in this case include oxygen, water vapor, dry air, carbon dioxide, carbon monoxide, nitrogen dioxide, and ozone, for example. It should be noted that if silane is used, then an unsaturated hydrocarbon gas such as ethylene, acetylene, or toluene can be used in concert therewith for the purpose of preventing reaction of the silane before it arrives on the glass surface.

Similarly, if a thin film preferably with aluminum oxide as its main component is formed through CVD as an undercoating film, then examples of the raw material for the aluminum include trimethylaluminum, aluminum triisopropoxide, diethylaluminum chloride, aluminum acetylacetonate, and aluminum chloride. In this case, examples of the oxidizing agent include oxygen, water vapor, and dry air.

If a transparent conductive film whose main component is tin oxide is formed through CVD, then it is preferable that in addition to the raw material for the tin, a chlorine atom containing gas is mixed in with the raw gas. By mixing in the chlorine atom containing gas, the projections of the transparent conductive film can be kept from becoming massive projections and their tip portions can be kept from becoming sharp angles. The technical basis for this is not completely clear, although the present inventors believe the following to be a likely explanation. When the chlorine atom containing gas reacts in a gaseous state with the tin raw material in the raw gas or hydrogen included in other mixed gases, it yields hydrogen chloride (HCl) gas. This hydrogen chloride gas exhibits an etching function when crystals of a transparent conductive film whose main component is tin oxide are formed, corroding the surface of the projections. For this reason, localized growth of the projections is not possible and the tip portion of the projections cannot maintain a sharp angle. As a result, the surface becomes relatively smooth, lacking prominent projections, and a transparent conductive film with an ideal surface shape that can contribute to the light-trapping effects expected of the electrode of a photoelectric conversion element is obtained. If the tip portion of the projections of the transparent conductive film is not sharp, then it becomes difficult for defects to occur as the films of the transparent conductive layer are formed, and inconveniences such as shorts and diminished photoelectric conversion efficiency in the photoelectric conversion device can be inhibited.

Here, it is preferable that hydrogen chloride, chlorine, or chloroform, for example, serves as the chlorine atom containing gas. In particular, hydrogen chloride naturally exhibits an etching action, and thus is useful if in the raw gas there is little of the component providing hydrogen or if the reaction system temperature is low.

It is preferable that the concentration of the chlorine atom containing gas is not more than 10 mole percent of the raw gas. When it exceeds 10 mole percent, there is a drop in the speed at which a transparent conductive film whose main component is tin oxide is formed. Although the technical basis behind why the film-formation speed drops is not clear, conceivable causes are that the etching action becomes too strong and that the addition of the chlorine atom containing gas interferes with the reaction that yields tin oxide through the reaction of a tin chloride and an oxidizing agent. On the other hand, when it is less than 0.1 mole percent, hardly any etching action is exhibited, although this also depends on the temperature of the film formation reaction system.

It should be noted that SEM photography can be used to confirm that the tip portions of the projections are not sharp angles. However, when the SEM photograph is low magnification, the shape of the projections may make the tip portions appear sharp, and thus the magnification is set to about 45,000 times or higher. If the transparent conductive film is formed through CVD, then the surface temperature of the transparent substrate, such as a glass sheet, is preferably at least 590° C. and even more preferably at least 615° C. There are no particular limitations with regard to the type of the substrate as long as it is a transparent insulating body. However, a glass sheet is ideal because chemical stability sufficient to withstand the hydrogen chloride gas is required.

The invention of the second embodiment, that is, a transparent conductive film in which the reflectance of the transparent conductive film is kept low by reducing the proportion of projections that can be seen to have trapezoid-shaped cross sections, and in which defects such as shorts are prevented by reducing the number of large trapezoid-shaped projections, is described next.

The transparent conductive film is formed on a transparent substrate and is provided with projections of various sizes. Also, the area occupied by projections with a trapezoid-shaped cross section in which the slope of the upper side with respect to the lower side is not more than 20° and the ratio of the length of the upper side with respect to the lower side (upper side length/lower side length) is 0.8 or more, is adjusted to a predetermined percentage. This percentage is not more than 10% of the surface area of the surface on which the transparent conductive film is formed, for example, the surface area of the surface of the substrate. After intense research into the relationship between the shape of the surface unevenness of the transparent conductive film and its reflectance, the present inventors found that if the above conditions are met, then the average reflectance from the transparent substrate side drops in the wavelength range of 300 to 1200 nm. When the percentage of the area occupied by the above projections is greater than 10%, the reflectance of the transparent conductive film increases. Therefore, there is a reduction in the amount of incident light on the photoelectric conversion layer and a drop in the photoelectric conversion rate.

Figure 8:
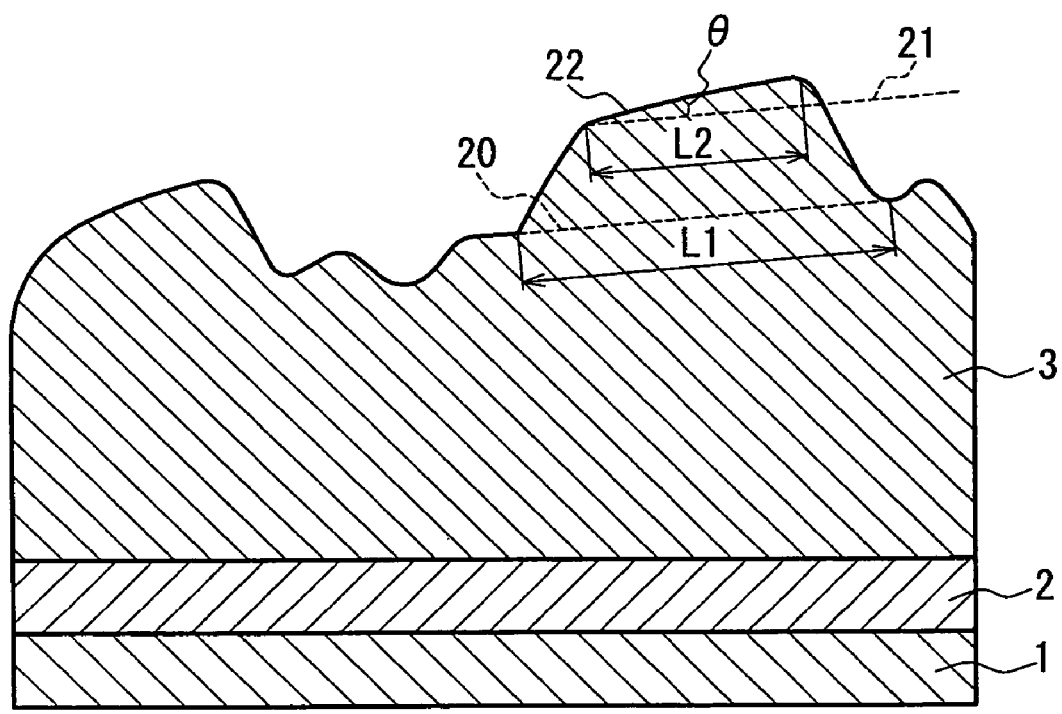
FIG. 8 is a conceptual diagram showing the cross-sectional shape of the transparent conductive film according to the invention of the second embodiment.
Figure 9:
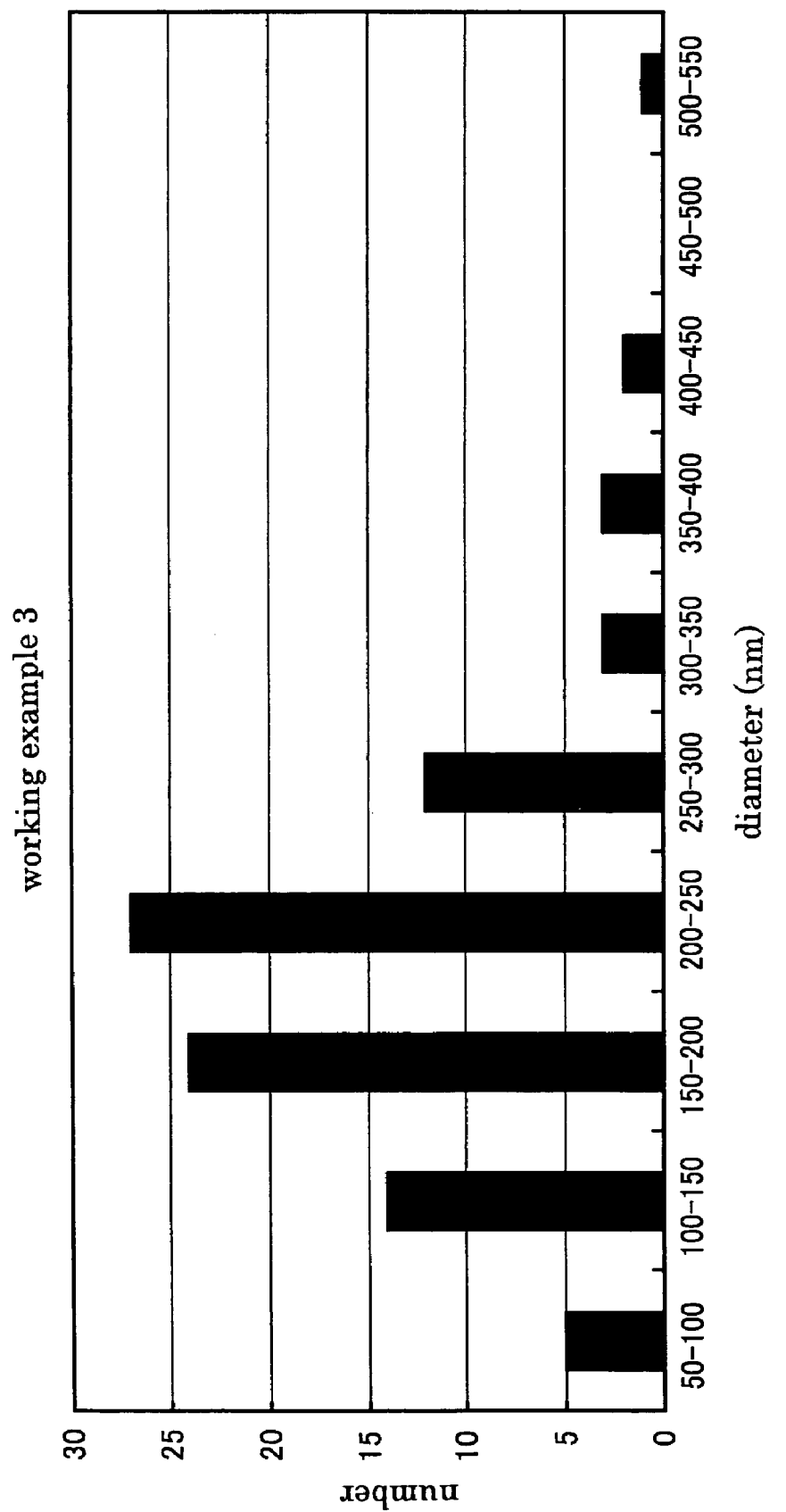
FIG. 9 is a diagram showing the distribution of the diameters of the projections of the transparent conductive film produced in Working Example 3 calculated from the maximum cross section area of the projections.

Here, as shown in FIG. 8, the lower side more precisely refers to a base line 20 of the projections in the surface of the transparent conductive film, and it is not necessarily in the surface of the transparent conductive film that is in contact with the transparent substrate or an undercoating film. The upper side is an upper edge 22 of the projections when the cross section shape is approximated to a trapezoid shape. If a line 21 is drawn parallel to the lower side, then the slope of the upper side to the lower side can be displayed by the angle θ formed between the parallel line 21 and the upper side. The ratio of the length of the upper side to the lower side is (upper side length)/(lower side length), and strictly speaking, the length of the upper side is defined as the length L2 in which the upper side is projected perpendicularly onto the parallel line 21. The ratio of the length of the upper side to the lower side is defined as L2/L1. The area occupied by each projection can be calculated as the area of the circle whose diameter is the lower side of the projection. The total area of this circle becomes the surface area occupied by that projection.

If the slope θ of the upper side to the lower side is greater than 20°, then the cross-sectional shape of the projection becomes near triangular, and can no longer be regarded as a trapezoid. The cross-sectional shape also becomes nearly triangular if the ratio of the length of the upper side to the lower side is less than 0.8. These conditions generally are for determining whether a projection can be regarded as trapezoid-shaped. To inhibit the reflectance, it is preferable that there are few projections that can be regarded as trapezoid-shaped, and it is desirable for the percentage occupied by these projections to be 1 to 5% of the surface area of the surface on which the transparent conductive film is formed.

Of the projections that are regarded as trapezoid-shaped, the area occupied by projections in which the lower side L1 is at least 450 nm is preferably not more than 5% of the area of the surface on which the transparent conductive film is formed. When this percentage is too high, the p-type amorphous silicon layer that is formed on the transparent conductive film becomes thin and shorts occur between the i-type layer formed thereon and the transparent conductive film, or the film thickness of the p-type layer becomes nonuniform, leading to heterogeneity in the p-i junction or the i-n junction. These result in a drop in the properties of the photoelectric conversion device.

The transparent conductive film is preferably formed through a thermal decomposition method in this embodiment as well. This is because a homogenous transparent conductive film having a desired surface shape can be formed through simple devices and means.

Of the thermal decomposition methods, CVD and particularly on-line CVD are preferable. Incidentally, to provide a uniform size in the surface unevenness and the projections, it is effective to control the glass temperature to within the range of 670° C. to 620° C. before the transparent conductive film is formed and to use helium or hydrogen or the like, which have a low gas density, as the carrier gas that supplies the raw gas that onto the glass. Gases with small densities easily create laminar flows because the Reynold's number of the gas is small, and can reduce the percentage of surface that is occupied by projections regarded as having trapezoid-shaped cross sections. Although helium is preferable as the low-density gas, it is also possible to use a density-adjusted mixed gas of helium and nitrogen, a mixed gas of helium and neon, or a mixed gas of helium and hydrogen. In the same manner as in the invention of the first embodiment, it is also possible to add a chlorine atom containing gas to the mixed gas.

The transparent conductive film according to the invention of the second embodiment is processed into a photoelectric conversion device through the same means as the transparent conductive film according to the invention of the first embodiment.

The invention of the third embodiment, that is, a transparent conductive film whose main component is tin oxide, which lacks massive projections that are protruding, and which has numerous relatively large projections, is described next.

The properties of the transparent conductive film are most effectively exhibited when it is utilized as the electrode of a photoelectric conversion device. In photoelectric conversion devices, low-resistance electrodes are necessary in order to extract the electrical energy generated at the photoelectric conversion layer without attenuation. Due to the structure of photoelectric conversion devices, the electrode is a thin-film type transparent conductive film. The electrical resistance of the thin film conductive film is inversely proportional to its thickness. However, when the conductive film is made too thick in an attempt to lower the resistance, the amount of light that is absorbed there increases and the conversion efficiency of the photoelectric conversion device drops. Taking into consideration these conflicting properties, at present the standard film thickness of transparent conductive films is 400 to 1000 nm. Accordingly, the present inventors conducted research on transparent conductive films that were at least 400 nm thick.

The transparent conductive film has tin oxide as its main component, and for example includes indium-doped tin oxide (ITO) or tin oxide ($SnO_2$) doped with either chlorine (Cl) or fluorine (F). Because each of these is a crystalline metallic oxide, tiny recessions and protrusions are formed in its surface when it is manufactured in mass quantities using a thermal composition method, a representative example of which is CVD. For example, when crystals of a fluorine-doped tin oxide ($SnO_2$:F) thin film are allowed to grow up to 400 nm thick, massive projections with heights of 400 nm or more can be seen scattered throughout its surface. However, as long as the unevenness in its surface is comprehensively determined using average values, as in conventional techniques, it is not possible to solve the problem of shorts occurring due to heterogeneity in the film thickness or pinholes and the problem of a drop in photoelectric conversion efficiency.

Accordingly, the present inventors intensively researched the production conductions for transparent conductive films produced using a thermal decomposition method and whose main component is tin oxide, and came upon a method that allowed relatively large projections to be arranged substantially uniformly across the surface of the transparent conductive film. In other words, in a case where the transparent conductive film is formed through thermal decomposition, it is a method for controlling the crystal growth conditions of the transparent conductive film, whose main component is tin oxide, by keeping the substrate surface at 550° C. to 650° C. and mixing into the raw gas (the gas for forming the film) suitable quantities of a gas that does not contribute to the thermal decomposition reaction.

When the temperature of the substrate surface exceeds 650° C., the speed of the thermal decomposition reaction becomes too fast, facilitating the localized growth of large crystal grains. This is because when relatively large crystal grains accidentally form in the thermal decomposition reaction system, the temperature around those crystal grains drops and they become the only spots where the reaction temperature is suitable, resulting in extremely fast crystal growth there. Thus, very large projections can be seen scattered about. On the other hand, when the substrate surface temperature is less than 550° C., the rate at which the crystals grow drops and the directionality of the crystals becomes weak and they grow radially, and as a result relatively small projections are formed uniformly. Thus, the transparent conductive film does not effectively exhibit light trapping effects. Also, the productivity of the transparent conductive film becomes extremely poor. Moreover, if the substrate surface temperature is 400° C. or less, then the tin oxide easily becomes noncrystalline and it becomes difficult for sufficiently large grains to form.

As the gas that is included in the carrier gas and that does not contribute to the thermal decomposition reaction, a gas whose density in a standard state is not more than 1 g/L is preferable, and the concentration of this gas in the raw gas is preferably at least 10 mole percent. The smaller the Reynold's number of the raw gas, the more easily it creates a laminar flow, and the gas does not easily aggregate disproportionally in parts of the substrate surface. As a result, the surface shape of the transparent conductive film becomes more uniform. Here, the Reynold's number refers to a dimensionless number $R=\rho LU/\eta = LU/\nu$ created from the length L, velocity U, density $\rho$, viscosity coefficient $\eta$, and kinematic viscosity $\nu=\eta/\rho$ representative of objects within a flow.

From the results of numerous experiments, the present inventors found that a gaseous substance whose density in a standard state is not more than 1 g/L is suitable as a gas that does not contribute to the thermal decomposition reaction. Although there are no particular limitations as to the type of this gas, it is preferably an inert gas, and examples thereof include the inert gases helium (He), neon (Ne), and argon (Ar). In particular, when the density is taken into account, helium (He) is most suitable. It should be noted that tin tetrachloride or a chlorine atom containing gas, for example, which were the most suitable gases in the first and the second embodiments, can be similarly used as this raw gas, and likewise, it is preferable that a glass sheet is used as the transparent substrate.

When a transparent conductive film whose main component is tin oxide is formed through this method, very uniform unevenness, in which the variance in the diameters of the projections is not more than 0.01 $\mu m^2$, is formed in its surface. With this transparent conductive film, the film thickness distribution of the p-type and/or n-type amorphous silicon layers becomes uniform, and nonuniformity at the p-i junction or n-i junction can be inhibited.

It is preferable that in the surface of the transparent conductive film there are not more than three projections having diameters 400 nm or more per 4 $\mu m^2$ and that there is at least one projection having a diameter of 350 nm or more per 4 $\mu m^2$. Such surface unevenness can be formed by suitably selecting the substrate temperature, the composition and flow amount of the raw gas, and the concentration of the carrier gas in the thermal decomposition method. If large projections with diameters 400 nm or more exist in greater quantities than 3 per 4 $\mu m^2$, then the film thickness of the amorphous silicon p-type and/or n-type layers becomes thin, and shorts occur between the i-type layer and the transparent conductive film. Also, the distribution of the film thickness of the p-type and/or n-type layers becomes nonuniform, leading to heterogeneity at the p-i or n-i junctions and resulting in a drop in the conversion efficiency of the photoelectric conversion element. On the other hand, if there are absolutely no projections with diameters at least 350 nm, then all the projections are small, and the light trapping effects are not adequately exhibited at the transparent conductive film surface.

The diameter and the distribution density of the projections is determined based on an SEM photograph (at about 50,000 times magnification) capturing the surface of the transparent conductive film. It should be noted that with respect to the diameter of the projections, the maximum cross section area of each projection can be found based on the SEM photograph using an image analysis device made by Nexus, and that area can be calculated under the assumption that it is a circle.

If a fluorine-doped tin oxide thin film ($SnO_2$:F) is formed, then doping can be carried out using hydrogen fluoride, trifluoroacetate, bromotrifluoromethane, or chlorodifluoromethane, for example, the raw material for the fluorine in the raw gas. If an ITO thin film is formed, then it is possible to use antimony pentachloride or antimony trichloride, for example. If a chlorine-doped tin oxide thin film ($SnO_2$:Cl) is formed, then it is possible to add hydrogen chloride, chlorine, or chloroform, for example, as the chlorine atom containing gas. In particular, hydrogen chloride itself exhibits etching action, and thus it is useful in inhibiting the formation of massive projections.

The transparent conductive film according to the invention of the third embodiment is processed into a photoelectric conversion device through the same means as the transparent conductive film according to the inventions of the first embodiment and the second embodiment.

The conditions mentioned above in the embodiments are closely related to one another, and can be attained simultaneously in a single transparent conductive film. Consequently, it is possible to produce a transparent conductive film provided with a plurality, or in certain cases, all, of the characteristics of the first through third embodiments.

WORKING EXAMPLES

Hereinafter, the invention will be described in detail through working examples, however, it is not limited to the following working examples.

Using the device shown in FIG. 2, thin films, including the transparent conductive film, were formed on a glass ribbon through on-line CVD. It should be noted that in order to keep the inside of the tin float bath at a slightly higher pressure than outside the bath, nitrogen at 98 volume percent and hydrogen at 2 volume percent were supplied into the space of the tin float bath to maintain a non-oxidizing atmosphere inside the bath.

Working Example 1

A mixed gas made of dimethyltin dichloride (vapor), oxygen, nitrogen, water vapor, and helium was supplied from the first coater 16a, which is located furthest upstream, onto a glass ribbon to form a 35 nm thick tin oxide thin film (first undercoating layer). Next, a mixed gas made of monosilane, ethylene, oxygen, and nitrogen was supplied from the second coater 16b to form a 25 nm thick silicon oxide thin film (second undercoating layer) on the tin oxide film. Then, a mixed gas made of 2.3 mole percent dimethyltin dichloride (vapor), 43 mole percent oxygen, 32 mole percent water vapor, 23 mole percent nitrogen, and hydrogen fluoride was supplied from a plurality of coaters (only 16c is shown) to form a 770 nm thick transparent conductive film made of tin oxide containing fluorine ($SnO_2$:F) on the silicon oxide thin film. It should be noted that the temperature of the glass ribbon immediately before the transparent conductive film is formed was 680° C. The raw gases used to form the undercoating films and the transparent conductive film and the film-formation conditions are shown together in Table 1.

The following points were confirmed from an SEM photograph of the surface of the transparent conductive film at an elevation angle of 30° and a magnification of 45,000 times. The number distribution of the height of the projections when applied to an $\chi^2$-type distribution function can be best approximated at a degree of freedom of 6.5. The number of projections with a height in the range of 50 to 350 nm was 97% of the total. The number distribution of the ratio of the height of the projections to the width of the projections when applied to an $\chi^2$-type distribution function can be best approximated at a degree of freedom of 21. The number of projections whose ratio was 0.25 to 1.05 was 96%. Moreover, the number of projections with a height in the range of 100 to 350 nm was 57%, and the number of projections whose height to width ratio was 0.35 to 0.95 was 85%. The number of projections with a height of 250 nm or more was 3.3% of the total.

Next, the average reflectance of the glass substrate provided with the transparent conductive film was found to be 9.5% by measuring the reflectance spectrum at wavelengths of 300 to 1200 nm using a spectrophotometer and then averaging the reflectance at 10 nm wavelength intervals. The average reflectance was measured with the glass sheet serving as the light incidence side.

Using the above SEM photograph, the slope of the upper side with respect to the lower side and the ratio of the length of the upper side to the lower side of each projection in the surface of the transparent conductive film were found. The area occupied by projections with trapezoid-shaped cross-sections having an upper side sloped not more than 20° with respect to the lower side and the ratio of the length of the upper side to the lower side at least 0.8, corresponded to 14% of the area of the surface on which the transparent conductive film was formed. Of these projections, the area occupied by projections with lower sides at least 450 nm long was 7.5% of the area of the surface on which the transparent conductive film was formed.

A 300 nm thick amorphous silicon thin film (photoelectric conversion layer) was formed on the glass sheet, on which the transparent conductive film was formed, through plasma CVD with monosilane serving as the raw material. A 300 nm thick silver layer (rear surface electrode) was then formed through electron beam deposition.

The properties of the photoelectric conversion device produced in this fashion were evaluated. First, the average reflectance of the photoelectric conversion device was calculated by measuring the reflectance spectrum at wavelengths of 300 to 1200 nm using a spectrophotometer and then averaging the reflectance at 10 nm wavelength intervals. The average reflectance of the photoelectric conversion device was 28%. Next, the conversion efficiency of the photoelectric conversion device was measured through publicly-known means. At this time, there were several locations for which measured data could not be obtained. This is likely because the projections of the transparent conductive film reached up to the i-type layer of the photoelectric conversion layer. Measurable locations were located and data on the photoelectric conversion efficiency were measured, which was found to be 8.8%. The properties of the above transparent conductive film and the properties of the photoelectric conversion device are shown collectively in Table 2.

Working Example 2

Aside from changing the raw gases and the film-formation conditions as shown in Table 1, undercoating films and a transparent conductive film were formed on a glass substrate in the same fashion as in Working Example 1. The properties thereof were evaluated based on an SEM photograph of the surface of the transparent conductive film at an elevation angle of 30° and a magnification of 45,000 times. The results showed that the number distribution of the height of the projections could be best approximated by an $\chi^2$ type distribution function at a degree of freedom of 6.5, the number of projections that have heights of 50 to 350 nm was 96%, and the number distribution of the ratio of the height to the width of the projections could be best approximated by an $\chi^2$ type distribution function at a degree of freedom of 20. The number of projections with a height to width ratio of 0.25 to 1.05 was 97%. The number of projections with a height of 100 to 350 nm was 59%, and the number of projections with a height to width ratio of 0.35 to 0.95 was 90%. The percentage of projections at least 250 nm high was 1.6%.

Next, in the same manner as in Working Example 1, the average reflectance of the glass sheet provided with the transparent conductive film was measured, and the calculated value was 8.5%. The reflectance spectrum of the transparent conductive film that was obtained in this measurement is shown in FIG. 7. From FIG. 7, it is clear that little interference is seen in this transparent conductive film.

Figure 4:
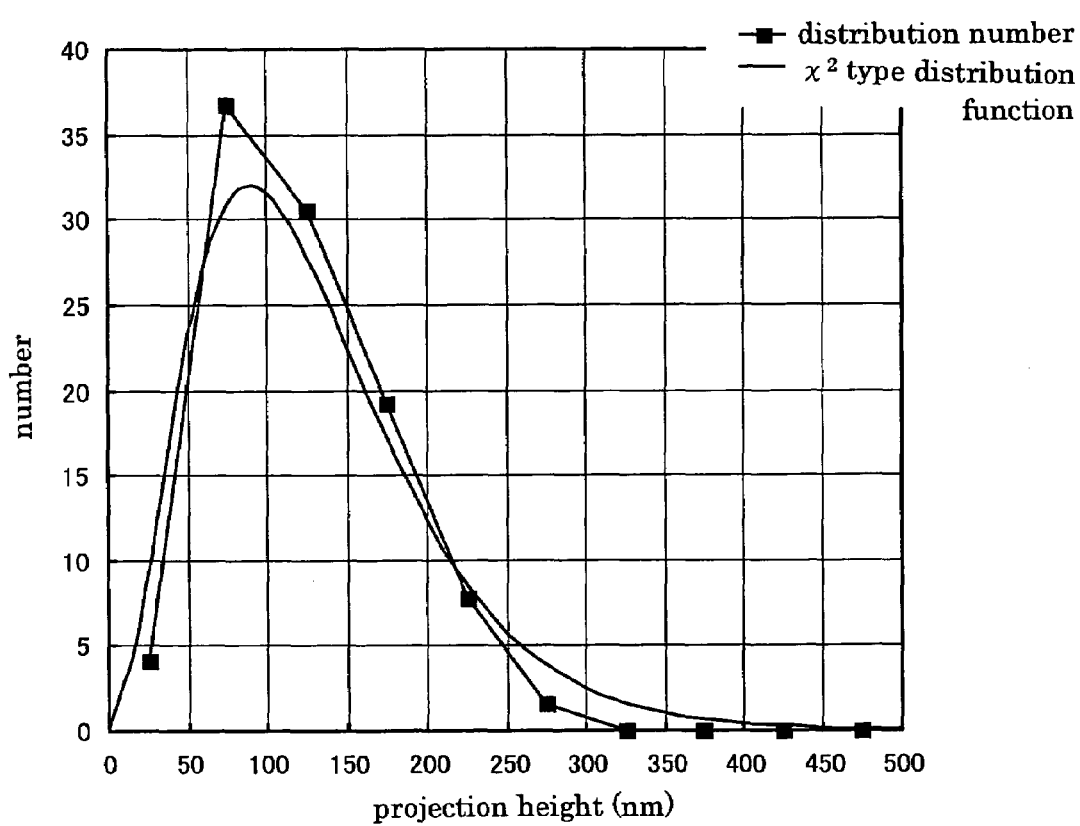
FIG. 4 is a diagram showing the number distribution function of the height of the projections of the transparent conductive film produced in Working Example 2.

FIGS. 4 and 5 show the number distribution function of the height of the projections of the transparent conductive film and the number distribution function of height/width of the projections of the transparent conductive film produced in Working Example 2, respectively.

Figure 6:
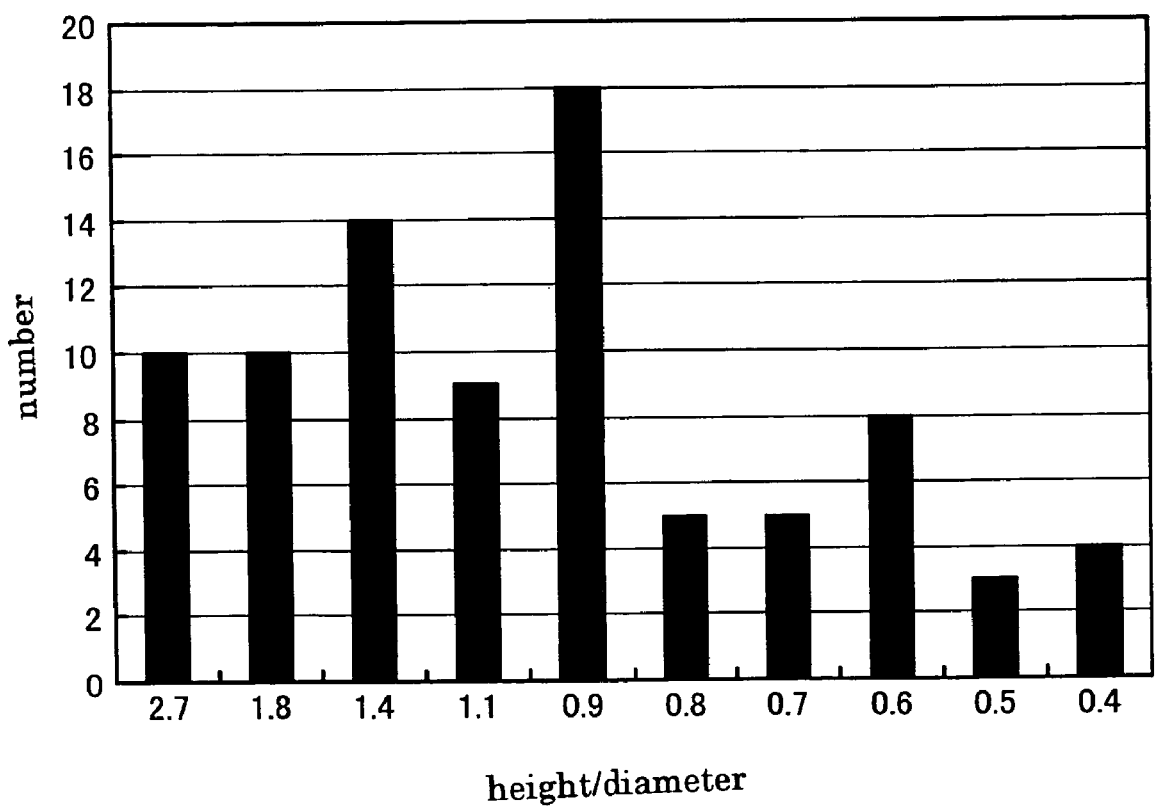
FIG. 6 is a diagram showing the number distribution function, measured using the method disclosed in JP H2-503615A, for the height/diameter of the projections of the transparent conductive film produced in Working Example 2.

Next, the number distribution indicating the height to width ratio of the projections was found according to the method described in JP H2-503615A. Following the method disclosed in this publication, the height of the projections was measured as a film thickness of t0 by a tracer-type film thickness meter, after which 0.5 μm diamond paste was used for polishing and a film thickness t1 at the point that the haze value is less than or equal to 2% was found, and t0-t1 was regarded as the height of the projection. For the diameter of the projections, a surface photograph was taken with an electron microscope and the area of each grain was found using an image analysis device produced by Nexus, and the diameter when the projections are taken as circular was found. The distribution diagram that was obtained is shown in FIG. 6. However, height to diameter ratios not only larger than the range of 0.7 to 1.2, which is set forth in the scope of the claims in the publication, but in excess of 2.0 were found. The presence of grains at this size is considered necessary to scatter light at long wavelengths.

The surface of the transparent conductive film was captured photographically using an SEM at an elevation angle of 30° and a magnification of 45,000 times. The slope of the upper side with respect to the lower side and the ratio of the length of the upper side to the lower side of each projection of the tin oxide film surface were found. The area occupied by projections with trapezoid-shaped cross-sections having an upper side sloped not more than 20° with respect to the lower side and the ratio of the length of the upper side with respect to the lower side at least 0.8 was 5% of the area of the surface on which the transparent conductive film was formed. Also, there were no projections with trapezoid-shaped cross sections and lower sides of 450 nm or more. This SEM photograph is shown in FIG. 3.

Moreover, a photoelectric conversion layer and a rear surface electrode were formed in the same fashion as in Working Example 1, producing a photoelectric conversion device. The average reflectance of this photoelectric conversion device was 24% and the photoelectric conversion efficiency was 9.7%. The properties of the transparent conductive film and the properties of the photoelectric conversion device are shown together in Table 2.

Working Examples 3 to 7

Conditions other than those shown in Table 1 were set in the same fashion as in Working Example 2 and undercoating films and a transparent conductive film were formed on a glass sheet, producing a glass sheet provided with a transparent conductive film. Moreover, for Working Examples 3, 4, and 6, a photoelectric conversion device was produced in the same manner as in Working Example 2. The properties of these transparent conductive films and the properties of the photoelectric conversion devices are shown collectively in Table 2.

Working Example 8

As shown in Table 1, hydrogen chloride is added to the raw gas for the transparent conductive film up to 5 mole percent, and the film-formation conditions that are not shown are set in the same manner as in Working Example 2 and undercoating films and a transparent conductive film were formed on a glass sheet. A portion of this glass sheet was cut away and the surface of the transparent conductive film was captured photographically at 45,000 times magnification using an SEM. This photograph is shown in FIG. 10.

Working Example 9

Hydrogen chloride was not added to the raw gas for the transparent conductive film as in Working Example 8, and all other conditions that are not shown are set in the same manner as in Working Example 2 and a glass sheet provided with undercoating films and a transparent conductive film was produced. A portion of this glass sheet provided with the transparent conductive film was cut away and the surface of the transparent conductive film was captured photographically at 45,000 times magnification using an SEM. This photograph is shown in FIG. 11.

Figure 11A:
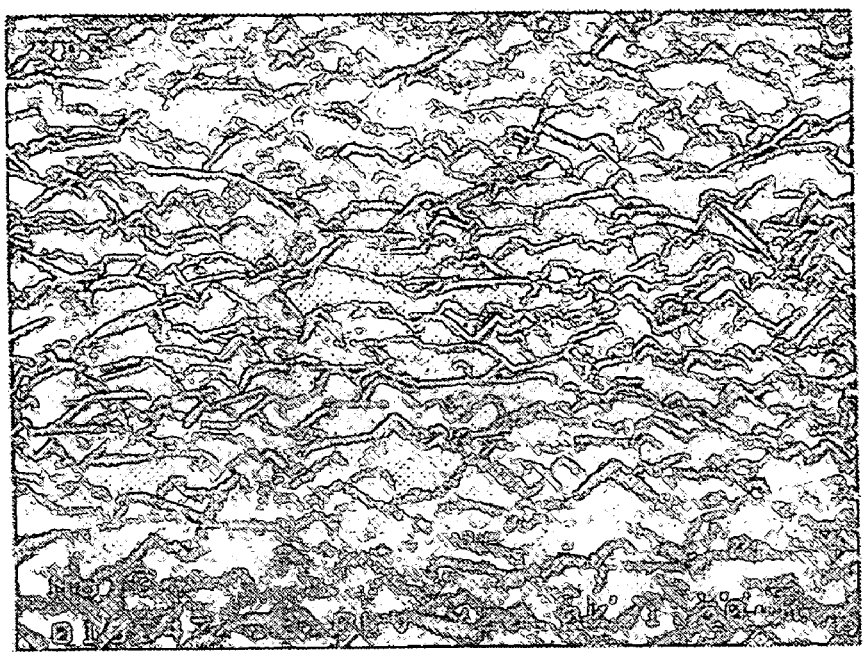
FIG. 11 shows the appearance of the surface of the transparent conductive film of Working Example 9 observed by SEM, where FIGS. 11A and 11B correspond to magnifications of 20,000 and 45,000 times, respectively.
Figure 11B:
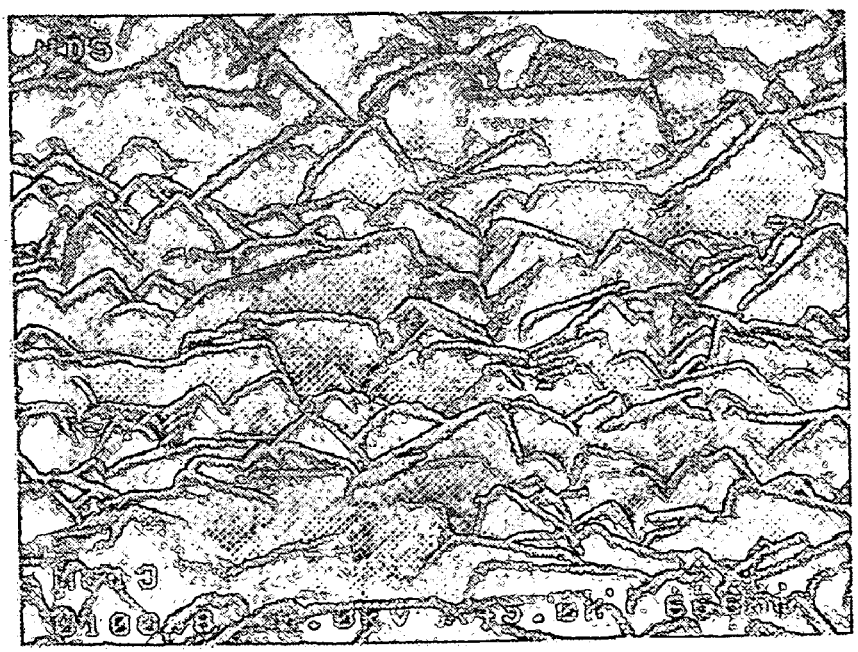

As is clear from the SEM photographs of FIG. 10 and FIG. 11, there are neither massive projections nor projections having tip portions with sharp angles in the surface of the transparent conductive film produced in Working Example 8. On the other hand, there are a plurality of projections with pointed tip portions in the surface of the transparent conductive film produced in Working Example 9.

Comparative Example 1

A transparent conductive film was formed through ordinary CVD (off-line CVD) instead of on-line CVD. A 4 mm thick soda-lime glass sheet with the same composition as in Working Example 1 and cut in advance to a size of 450×450 mm is placed on a mesh belt and sent through a heating furnace, and was heated up to approximately 600° C. As this heated glass sheet was delivered further, a mixed gas made of monosilane, oxygen, and nitrogen was supplied from coaters provided above the glass delivery route, forming a 25 nm thick silicon oxide film on the glass sheet. After the glass sheet was cooled it was once again placed on the mesh belt and sent through the heating furnace, and was heated to approximately 600° C. This heated glass was then further delivered and at the same time a mixed gas made of monobutyltin trichloride (vapor), oxygen, water vapor, nitrogen, and trifluroacetate was supplied from coaters positioned above the glass delivery route, forming an 800 nm thick transparent conductive film made of fluorine-doped tin oxide on the silicon oxide film.

From an SEM photograph of the surface of the transparent conductive film taken at 45,000 times magnification, it was clear that the number distribution of the height of the projections can be best approximated by an $\chi^2$-type distribution function at a degree of freedom of 6, the number of projections with heights of 50 to 350 nm was 95%, the number distribution of the ratio of the height to the width of the projections could be best approximated by an $\chi^2$-type distribution function at a degree of freedom of 23, and the number of projections with a height to width ratio of 0.25 to 1.05 was 89% of the total. The number of projections with a height of 100 to 350 nm was 55%, and the number of projections with a height to width ratio of 0.35 to 0.95 was 79%. The percentage of projections at least 250 nm high was 17%, and the average reflectance of the glass sheet provided with the transparent conductive film was 12.5%.

Then, a photoelectric conversion layer and a rear surface substrate were formed on the glass sheet provided with the transparent conductive film in the same manner as in Working Example 1, producing a photoelectric conversion device. The average reflectance of this photoelectric conversion device was 12.5% and the photoelectric conversion efficiency was 7.1%. The properties of the transparent conductive film and the properties of the photoelectric conversion device are shown collectively in Table 2.

Comparative Example 2

As shown in Table 1, a mixed gas made of dimethyltin dichloride (vapor), oxygen, nitrogen, and helium is supplied onto a glass sheet in the same manner as in Working Example 2, forming a 35 nm thick tin oxide film (first undercoating layer), a 25 nm thick silicon oxide film (second undercoating layer) is formed on the first undercoating layer, and a mixed gas made of dimethyltin dichloride (vapor), oxygen, water vapor, nitrogen, and trifluoroacetate was supplied to form a 950 nm thick transparent conductive film made of tin oxide doped with fluorine on the silicon oxide film. Then, the transparent conductive film was polished and made somewhat smooth, after which unevenness was formed in the surface of the transparent conductive film through a blasting technique in which sand is blown from ejection nozzles as polishing particles. The thickness of the film at this time was approximately 770 nm, and a spot in which the unevenness in the surface was relatively uniform was selected and the following measurements were performed.

The surface of the transparent conductive film was captured photographically using an SEM at 45,000 times magnification, and the shape of the unevenness in its surface was confirmed. As a result, it was confirmed that the number distribution of the height of the projections demonstrated a normal distribution centered substantially around 200 nm. The number of projections with heights in the range of 50 to 350 nm was 100%. It was also found that the number distribution of the height to width ratio of the projections followed a normal distribution centered substantially at 0.3. The number of projections with height to width ratios of 0.25 to 1.05 was 95%. Also, the number of projections with heights in the range of 100 to 350 nm was 98% of the total and the number of projections with height to width ratios of 0.35 to 0.95 was 10%. Also, the number of projections with heights at least 250 nm was 1% and the average reflectance of the transparent conductive film was 21.7%. The properties of the transparent conductive film are also shown in Table 2.

TABLE 1

| | | Working Example | | | | | | | | | Comparative Example | |
|---|---|---|---|---|---|---|---|---|---|---|---|---|
| Items | | 1 | 2 | 3 | 4 | 5 | 6 | 7 | 8 | 9 | 1 | 2 |
| First Undercoating layer $SnO_2$ Thin Film | Dimethyl dichloride | ○ | ○ | ○ | ○ | ○ | ○ | ○ | ○ | ○ | | ○ |
| | Oxygen | ○ | ○ | ○ | ○ | ○ | ○ | ○ | ○ | ○ | | ○ |
| | Nitrogen | ○ | ○ | ○ | ○ | ○ | ○ | ○ | ○ | ○ | | ○ |
| | Water Vapor | ○ | X | X | X | X | X | X | X | X | | X |
| | Helium | ○ | ○ | ○ | ○ | ○ | ○ | ○ | ○ | ○ | | ○ |
| | Film Thickness | 35 nm | 40 nm | 40 nm | 40 nm | 40 nm | 40 nm | 40 nm | 35 nm | 35 nm | | 35 nm |
| Second Undercoating layer $SiO_2$ Thin Film | Monosilane | ○ | ○ | ○ | ○ | ○ | ○ | ○ | ○ | ○ | ○ | ○ |
| | Ethylene | ○ | ○ | ○ | ○ | ○ | ○ | ○ | ○ | ○ | X | ○ |
| | Oxygen | ○ | ○ | ○ | ○ | ○ | ○ | ○ | ○ | ○ | ○ | ○ |
| | Nitrogen | ○ | ○ | ○ | ○ | ○ | ○ | ○ | ○ | ○ | ○ | ○ |
| | Film Thickness | 25 nm | 25 nm | 25 nm | 25 nm | 25 nm | 25 nm | 25 nm | 25 nm | 25 nm | 25 nm | 25 nm |
| Transparent Conductive Film $SnO_2$:F Thin Film | Dimethyl dichloride | 2.3 | 2.5 | 2.5 | 2.5 | 3 | 3 | 3 | 3 | 3 | ○ (*1) | 2.5 |
| | Oxygen | 43 | 40 | 40 | 40 | 42 | 42 | 42 | 40 | 42 | ○ | 40 |
| | Water Vapor | 32 | 30 | 30 | 30 | 31 | 31 | 31 | 30 | 31 | ○ | 30 |
| | Nitrogen | 23 | 1.5 | 6.5 | 10.5 | 2 | 23 | 23 | 1 | 2 | ○ | 1.5 |
| | Hydrogen Fluoride | | | | | 1 | 1 | 1 | 1 | 1 | ○ (*2) | (*2) |
| | Helium | X | 26 | 21 | 17 | X | X | X | 20 | 21 | X | 26 |
| | Hydrogen Chloride | X | X | X | X | X | X | X | 5 | X | X | X |
| | Film Thickness | 770 nm | 890 nm | 950 nm | 790 nm | 800 nm | 780 nm | 630 nm | 800 nm | 800 nm | 800 nm | 770 nm |
| | Glass Temperature | 680° C. | 640° C. | 610° C. | 630° C. | 670° C. | 670° C. | 670° C. | 630° C. | 670° C. | 600° C. | 640° C. |
| Photoelectric Conversion Layer Amorphous Silicon Thin Film | Monosilane | ○ | ○ | ○ | ○ | | ○ | | ○ | | ○ | |
| | Film Thickness | 300 nm | 300 nm | 300 nm | 300 nm | | 300 nm | | 300 nm | | 300 nm | |
| Rear Surface Electrode | Type | Ag | Ag | Ag | Ag | | Ag | | Ag | | Ag | |
| | Film Thickness | 300 nm | 300 nm | 300 nm | 300 nm | | 300 nm | | 300 nm | | 300 nm | |
| Remarks | | — | — | — | — | — | — | — | — | — | Off Line | Sand Blast |

(*1) Use monobutyltin trichloride in place of dimethyltin dichloride
(*2) Use trifluroacetate in place of hydrogen fluoride
Note:
An ○ indicates that raw material is included,
X indicates that it is not included, and values without units are percentages at which a component is present expressed in mol %.

TABLE 2

| | Items | Favorable Range | Working Example | | | | | | | Comparative Example | |
|---|---|---|---|---|---|---|---|---|---|---|---|
| | | | 1 | 2 | 3 | 4 | 5 | 6 | 7 | 1 | 2 |
| $X^2$ | 50 to 350 nm height (%) | 70% or more | 97 | 96 | 75 | 94 | 77 | 74 | 73 | 95 | 100 |
| | Height/Width 0.25 to 1.05 (%) | 90% or more | 96 | 97 | 95 | 96 | 92 | 95 | 91 | 89 | 95 |
| | 100 to 350 nm height (%) | 30% or more | 57 | 59 | 35 | 51 | 40 | 30 | 30 | 55 | 98 |

TABLE 2-continued

|  | Items | Favorable Range | Working Example | | | | | | | Comparative Example | |
| --- | --- | --- | --- | --- | --- | --- | --- | --- | --- | --- | --- |
|  |  |  | 1 | 2 | 3 | 4 | 5 | 6 | 7 | 1 | 2 |
|  | Height/Width 0.35 to 0.95 (%) | 80% or more | 85 | 90 | 83 | 87 | 81 | 83 | 82 | 79 | 10 |
|  | 250 nm or more height (%) | 0.2 to 20% | 3.3 | 1.6 | 0.3 | 1.2 | 0.6 | 0.5 | 0.2 | 17 | 1 |
|  | Height distribution follows $X^2$ type with degree of freedom of 3.5 to 15 |  | ○ | ○ | ○ | ○ | ○ | ○ | ○ | ○ | X |
|  | Ratio of height/width follows $X^2$ type with degree of freedom of 3.5 to 15 |  | ○ | ○ | ○ | ○ | ○ | ○ | ○ | ○ | X |
| Trapezoid | Area occupied by trapezoid 1 (*1) | 10% or less | 14 | 5 | 4 | 5 | 7 | 5 | 4 |  |  |
|  | Area occupied by trapezoid 2 (*2) | 5% or less | 7.5 | 0 | 0 | 0 | 3 | 1 | 0 |  |  |
| Density | Transparent conductive film thickness (nm) | 400 nm or more | 770 | 890 | 950 | 790 | 800 | 780 | 630 | 800 | 770 |
|  | Diameter distribution variance | 0.01 or less |  | 0.008 | 0.008 | 0.009 | 0.011 | 0.012 | 0.012 |  |  |
|  | Density of diameter 400 nm or more | 3 per 4 μm² or less |  | 2 | 3 | 2 | 4 | 4 | 0 |  |  |
|  | Density of diameter 350 nm or more | 1 per 4 μm² or more |  | 7 | 6 | 4 | 6 | 5 | 0 |  |  |
| Effect | Average reflectance of transparent conductive film (%) | 10% or less | 9.5 | 8.5 | 8.2 | 8.3 | 8.1 | 8.1 | 8.3 | 12.5 | 21.7 |
|  | Average reflectance of rear surface electrode (%) |  | 28 | 24 | 22 | 23 |  | 22 |  | 36 |  |
|  | Film defects in photoelectric conversion layer | No pinholes or shorts | Yes | No | No | No | Yes | Yes | No | Yes |  |
|  | Photoelectric conversion efficiency (%) | Higher the better | 8.8 | 9.7 | 9.6 | 9.5 |  | 9.1 |  | 7.1 |  |

(*1) Slope of upper side to lower side is 20° or less and ratio of length of upper side to lower side is at least 0.8.
(*2) Above *1 + lower side is at least 450 nm.
Note: An ○ indicates that number distribution for projections follows $X^2$ type, and X indicates that it does not.

The following aspects become clear by comparing and evaluating these working examples and comparative examples.

By comparing Working Examples 1 to 7 to Comparative Examples 1 and 2, it is clear that if the shape of the surface of the transparent conductive film meets the criteria of the invention of the first embodiment, then the reflectivity of the transparent conductive film drops noticeably and as a result the photoelectric conversion efficiency is improved.

By comparing Working Example 1 to Working Examples 2 to 4, it is clear that if the projections of the transparent conductive film meet the criteria of the invention of the second embodiment, then shorts do not occur in the photoelectric conversion device and the reflectivity of the transparent conductive film also drops, resulting in improved photoelectric conversion efficiency. It should be noted that shorts occurred in Working Example 1 conceivably because water vapor was used in the formation of the first undercoating film, thus increasing the size of the recessions and protrusions in the surface of the first undercoating layer and leading to localized growth of crystals of the transparent conductive film originating at the projections of the undercoating film. Another conceivable reason for the progression of localized growth which forming the transparent conductive film is that the raw gas did not include helium.

By comparing Working Examples 2 to 4 and Working Examples 5 to 7, it is clear that by mixing helium into the raw gas when forming the transparent conductive film, a transparent conductive film that meets the criteria of the invention of the third embodiment is obtained. In other words, it was found that if the transparent conductive film is formed by a thermal decomposition method, then by suitably mixing in low-density gas with a density of not more than 1 g/L into the raw gas it is possible to inhibit the formation of massive projections. Large projections did not form in the surface of the transparent conductive film in Working Example 7, and this is likely because the thickness of the transparent conductive film was thinner than in Working Examples 5 and 6.

By comparing Working Example 8 to Working Example 9, it is clear that the surface of the projections of the transparent conductive film is etched if a chlorine atom containing gas is added to the raw gas for the transparent conductive film, eliminating the sharp top portions of the projections. Accordingly, it can be presumed that a photoelectric conversion layer with few defects will be formed if the photoelectric conversion layer is formed on this transparent conductive film.

The invention is configured as set forth above, and thus exhibits the following effects.

According to the invention of the first embodiment, in the transparent conductive film, light at wavelengths longer than the absorption region of amorphous silicon can be scattered effectively and the average reflectance can be lowered. Also, it is possible to provide a photoelectric conversion device with improved photoelectric conversion efficiency by providing the transparent conductive film on a transparent substrate.

According to the invention of the second embodiment, the average reflectance can be lowered and defects such as shorts can be kept from occurring by reducing the proportion of the transparent conductive film occupied by massive projections with trapezoid-shaped cross sections. Also, it is possible to provide a photoelectric conversion device with high photoelectric conversion efficiency and no defects such as shorts or pinholes by providing the transparent conductive film on a transparent substrate.

According to the invention of the third embodiment, there are no protruding massive projections and numerous relatively large projections in the transparent conductive film, and thus the light trapping effects can be exhibited effectively in the photoelectric conversion layer without the occurrence of defects such as shorts. Also, it is possible to provide a photoelectric conversion device with which a rated output can be reliably obtained by providing this transparent conductive film on a transparent substrate.

The invention claimed is:

1. A substrate for a photoelectric conversion device, comprising a transparent conductive film, a transparent substrate, and an undercoating film that is provided between the transparent substrate and the transparent conductive film,
   wherein, with respect to projections present in a surface of the transparent film,
   the average value of a number distribution of height is larger than its mode, and when the number distribution of height is regarded as following an $\chi^2$ type distribution function in which a horizontal axis is displayed in nanometer units, then the degree of freedom with which it can best be approximated is 3.5 to 15;
   the average value of a number distribution of the height/width ratio is larger than its mode, and when the number distribution of the height/width ratio is regarded as following an $\chi^2$ type distribution function, then the degree of freedom with which it can best be approximated is 10 to 35;
   the number of projections having a height of 50 to 350 nm is at least 70%; and
   the number of projections having a height/width ratio of 0.25 to 1.05 is at least 90%, and
   the undercoating film comprises:
      a first undercoating layer whose refractive index is 1.6 to 2.5 and whose film thickness is 5 to 100 nm, and
      a second undercoating layer whose refractive index is 1.4 to 2.0 and whose film thickness is 5 to 100 nm.

2. The substrate according to claim 1, wherein, with respect to the projections, the number of projections having heights of 100 to 350 nm is at least 30%, and the number of projections having height/width ratios of 0.35 to 0.95 is at least 80%.

3. The substrate according to claim 1, wherein, with respect to the projections, the number of projections having heights of 250 nm or more is 0.2 to 20%.

4. The substrate according to claim 1, wherein an area occupied by projections which, when their cross section shape is regarded as a trapezoid, have a slope of an upper side with respect to a lower side of the trapezoid of not more than 20° and a ratio of a length of the upper side with respect to the lower side of at least 0.8, corresponds to not more than 10% of an area of a surface on which the transparent conductive film is formed.

5. The substrate according to claim 1, wherein tin oxide is a main component, the film thickness is at least 400 nm, and the variance of the diameter of the projections in its surface is not more than 0.01 $\mu m^2$.

6. The substrate according to claim 1, wherein an average reflectance at wavelengths of 300 to 1200 nm with the transparent substrate on an incident side is not more than 10%.

7. A photoelectric conversion device, comprising:
   the substrate according to claim 1, and
   at least one photoelectric conversion layer.

8. A substrate for a photoelectric conversion device, comprising a transparent conductive film, a transparent substrate, and an undercoating film that is provided between the transparent substrate and the transparent conductive film,
   wherein the transparent conductive film whose area occupied by projections that, when their cross section shape is regarded as a trapezoid, have a slope of an upper side with respect to a lower side of the trapezoid of not more than 20° and a ratio of a length of the upper side with respect to the lower side at least 0.8, corresponds to not more than 10% of an area of a surface on which the transparent conductive film is formed, and
   wherein the undercoating film comprises:
      a first undercoating layer whose refractive index is 1.6 to 2.5 and whose film thickness is 5 to 100 nm, and
      a second undercoating layer whose refractive index is 1.4 to 2.0 and whose film thickness is 5 to 100 nm.

9. The substrate according to claim 8, wherein an area occupied by the projections whose lower side is at least 450 nm corresponds to not more than 5% of the area of the surface on which the transparent conductive film is formed.

10. The substrate according to claim 8, wherein tin oxide is a main component, a film thickness is at least 400 nm, and the variance of the diameter of the projections in its surface is not more than 0.01 $\mu m^2$.

11. The substrate according to claim 8, wherein an average reflectance at wavelengths of 300 to 1200 nm with the transparent substrate on an incident side is not more than 10%.

12. A photoelectric conversion device, comprising:
   the substrate according to claim 8, and
   at least one photoelectric conversion layer.

* * * * *

UNITED STATES PATENT AND TRADEMARK OFFICE
CERTIFICATE OF CORRECTION

| | |
|---|---|
| PATENT NO. | : 7,332,226 B2 |
| APPLICATION NO. | : 10/432505 |
| DATED | : February 19, 2008 |
| INVENTOR(S) | : Fujisawa et al. |

Page 1 of 1

It is certified that error appears in the above-identified patent and that said Letters Patent is hereby corrected as shown below:

Title page, item [73] first column, second-listed assignee: --Kaneka Corporation, Osaka (JP)-- should appear.

Signed and Sealed this

Eleventh Day of November, 2008

JON W. DUDAS
*Director of the United States Patent and Trademark Office*